US011444142B2

United States Patent
Bao et al.

(10) Patent No.: US 11,444,142 B2
(45) Date of Patent: Sep. 13, 2022

(54) DISPLAY PANEL AND PREPARATION METHOD, DETECTION METHOD AND DISPLAY DEVICE THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zheng Bao, Beijing (CN); Yaqin Xia, Beijing (CN); Yanxia Xin, Beijing (CN); Gong Chen, Beijing (CN); Hongwei Hu, Beijing (CN); Yihao Wu, Beijing (CN); Xueping Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/771,646

(22) PCT Filed: Jan. 6, 2020

(86) PCT No.: PCT/CN2020/070402
§ 371 (c)(1),
(2) Date: Jun. 10, 2020

(87) PCT Pub. No.: WO2020/248597
PCT Pub. Date: Dec. 17, 2020

(65) Prior Publication Data
US 2022/0102456 A1    Mar. 31, 2022

(30) Foreign Application Priority Data
Jun. 13, 2019 (CN) .......................... 201910510151.4

(51) Int. Cl.
*H01L 27/32* (2006.01)
*G09G 3/00* (2006.01)

(52) U.S. Cl.
CPC ......... *H01L 27/3262* (2013.01); *G09G 3/006* (2013.01); *G09G 2330/12* (2013.01); *H01L 2227/323* (2013.01)

(58) Field of Classification Search
CPC . H01L 27/3262; H01L 27/3276; G09G 3/006; G09G 2320/029; G09G 2320/0295;
(Continued)

(56) References Cited

U.S. PATENT DOCUMENTS 8,895,970 B2 * 11/2014 Kim ...................... H01L 27/124
                                                    257/E51.019
10,580,338 B2 * 3/2020 Park ........................ G09G 3/006
(Continued)

FOREIGN PATENT DOCUMENTS

CN    101236338 A    8/2008
CN    103268879 A    8/2013
(Continued)

OTHER PUBLICATIONS

ISA National Property Administration of the People's Republic of China, International Search Report Issued in Application No. PCT/CN2020/070402, dated Apr. 2, 2020, WIPO, 11 pages.

*Primary Examiner* — Sardis F Azongha
(74) *Attorney, Agent, or Firm* — McCoy Russell LLP

(57) ABSTRACT

The present application discloses embodiments of a display panel, a preparation method thereof, a detection method thereof, and a display device for improving an accuracy of detecting electrical properties of transistors. In one embodiment, a display panel may include a display area including a plurality of pixels and a non-display area surrounding the display area, wherein each of the plurality of pixels may include a display pixel circuit, and the non-display area may include one or more test pixel circuits, each of the one or more test pixel circuits having an equivalent circuit structure to the display pixel circuit, where the one or more test pixel
(Continued)

circuits may include a plurality of transistors, and electrodes of at least one of the plurality of transistors may be respectively conductively coupled to different test pads.

19 Claims, 16 Drawing Sheets

(58) Field of Classification Search
CPC ............ G09G 2330/12; G01R 31/2601; G01R 31/2607
See application file for complete search history.

(56) References Cited

U.S. PATENT DOCUMENTS

| | | | |
|---|---|---|---|
| 2001/0050565 A1* | 12/2001 | Petersen | ................ G01R 27/14 324/756.07 |
| 2007/0178614 A1 | 8/2007 | Arasawa et al. | |
| 2008/0123005 A1 | 5/2008 | Sohn et al. | |
| 2009/0231255 A1 | 9/2009 | Tanimoto et al. | |
| 2014/0184969 A1* | 7/2014 | Ro | .................... G02F 1/136286 257/48 |
| 2015/0022211 A1* | 1/2015 | Du | ........................ G09G 3/006 324/414 |
| 2015/0255527 A1* | 9/2015 | Oooka | ................ H01L 27/3276 438/18 |
| 2016/0379907 A1 | 12/2016 | Ko et al. | |

FOREIGN PATENT DOCUMENTS

| | | |
|---|---|---|
| CN | 105304517 A | 2/2016 |
| CN | 110190106 A | 8/2019 |

* cited by examiner

DISPLAY PANEL AND PREPARATION METHOD, DETECTION METHOD AND DISPLAY DEVICE THEREOF

CROSS-REFERENCE TO RELATED APPLICATIONS

The present application is a U.S. National Phase of International Patent Application Serial No. PCT/CN2020/070402 entitled "DISPLAY PANEL, MANUFACTURING AND DETECTION METHODS THEREOF, AND DISPLAY DEVICE" filed on Jan. 6, 2020. International Patent Application Serial No. PCT/CN2020/070402 claims priority to Chinese Patent Application No. 201910510151.4 filed on Jun. 13, 2019. The entire contents of each of the above-referenced applications are hereby incorporated by reference for all purposes.

TECHNICAL FIELD

The present description relates generally to the field of display technologies, and embodiments of a display panel, a manufacturing method thereof, a detection method thereof, and a display device.

BACKGROUND AND SUMMARY

With continuous developments in display technology, organic light emitting diode (OLED) display panels have been increasingly used in various electronic devices due to desirable properties thereof, such as self-illumination, wide viewing angle, high contrast, low power consumption, and high response speed. At present, many undesirable issues occur in a display area (also referred to as the so-called "AA" area) of the OLED display panel.

The present disclosure aims to solve or alleviate at least some of the issues existing in the prior art. As described herein, a display panel, a preparation method thereof, a detection method thereof, and a display device area are proposed. As presented, the embodiments of the present disclosure may improve an accuracy of detecting electrical properties of a transistor.

In general, difficulties exist in detecting electrical properties of thin-film transistor (TFT) pixel driving circuits (that is, pixel driving circuits including a plurality of TFTs), which are key components of organic light emitting diode (OLED) display panels. Since OLED display panels are formed by stacking a plurality of thin films, the TFT pixel driving circuit may be covered by a film layer, thereby obfuscating the electrical properties of the TFT pixel driving circuit in the display area from direct measurement. Typically, monitoring such electrical properties of the TFT pixel driving circuit of the OLED display panel includes setting a test element group (TEG) in a test area, where the TEG includes a portion of the TFTs of the TFT pixel driving circuit. Thus, the electrical properties of the TFT pixel driving circuit in the TEG may be measured to characterize the electrical properties of the TFT pixel driving circuit in the display area. However, TFTs in the TEG are typically independent of one another, whereas TFTs in the display area are typically interconnected to one another. Further, surrounding physical factors, such as parasitic capacitance coupling, together with process instability, may be barriers for the TFTs in the TEG to track and predict electrical properties of the display area. As such, the TFTs in the TEG may not accurately characterize the electrical properties of the TFTs in the display area.

Accordingly, an exemplary embodiment of the present disclosure provides a display panel comprising a display area comprising a plurality of pixels, and a non-display area surrounding the display area, wherein each of the plurality of pixels comprises a display pixel circuit, and the non-display area comprises one or more test pixel circuits, each of the one or more test pixel circuits having an equivalent circuit structure to the display pixel circuit, where the one or more test pixel circuits include a plurality of transistors, and electrodes of at least one of the plurality of transistors are respectively conductively coupled to different test pads.

In the display panel, the non-display area includes each of the one or more test pixel circuits having an equivalent circuit structure to any of the display pixel circuits, that is, a portion of the plurality of transistors in the one or more test pixel circuits are conductively coupled in a manner such that electrical properties of a portion of the plurality of transistors in a given display pixel circuit in the display area may be simulated, as the electrical properties of the portion of the plurality of transistors in the test pixel circuit are substantially similar to the electrical properties of the portion of the plurality of transistors in the given display pixel circuit. In this way, the electrical properties of the portion of the plurality of transistors in the test pixel circuit may characterize the electrical properties of the portion of the plurality of the transistors in the display pixel circuit, and an accuracy of detecting the electrical properties of the plurality of transistors as a whole may be improved. Further, since electrodes of at least one of the plurality of transistors may be respectively coupled to different test pads, each electrode of the at least one of the plurality of transistors may be electrically tested by using an electrical test device without any additional process, such that batch detection may be realized.

Optionally, the non-display area further comprises a plurality of environmental pixel circuits, each of the plurality of environmental pixel circuits having an equivalent circuit structure to the display pixel circuit, where the plurality of environmental pixel circuits surrounds at least one of the one or more test pixel circuits.

The display panel may further include a plurality of environmental pixel circuits surrounding the one or more test pixel circuits in the non-display area, such that an environmental condition of the display pixel circuit may be realistically simulated, that is, such that the portion of the plurality of transistors in the one or more test pixel circuits may accurately represent the portion of the plurality of transistors in the display pixel circuit. In this way, an electrical test may be performed on the electrodes of the portion of the plurality of transistors in the one or more test pixel circuits, and results of the electrical test may accurately reflect the electrical properties of the portion of the plurality of transistors in the display pixel circuit, thereby improving the accuracy of detecting the electrical properties of the plurality of transistors as a whole.

Optionally, each of the one or more test pixel circuits is surrounded by eight environmental pixel circuits of the plurality of environmental pixel circuits, such that any one of the one or more test pixel circuits and a corresponding eight surrounding environmental pixel circuits are arranged in a 3×3 array, the one of the one or more test pixel circuits included in the 3×3 array being located at a center of the 3×3 array.

Optionally, the one or more test pixel circuits comprise one or more 3×3 arrays of test pixel circuits, and each of the one or more 3×3 arrays of test pixel circuits is surrounded by sixteen environmental pixel circuits of the plurality of environmental pixel circuits, such that any one of the one or more 3×3 arrays of test pixel circuits and a corresponding sixteen surrounding environmental pixel circuits are arranged in a 5×5 array, the one of the one or more 3×3 arrays of test pixel circuits included in the 5×5 array being located at a center of the 5×5 array.

Optionally, electrodes of each of the plurality of transistors included in the one or more test pixel circuits are respectively conductively coupled to different test pads.

Optionally, each of the one or more test pixel circuits comprises a first group of transistors, the first group of transistors comprising a driving thin-film transistor (TFT), the driving TFT comprising a gate electrode, a source electrode, and a drain electrode, the gate electrode conductively coupled to a gate test pad, the source electrode conductively coupled to a source test pad, and the drain electrode conductively coupled to a drain test pad.

Optionally, the one or more test pixel circuits include a first group of transistors, each of the first group of transistors comprising a first transistor and a second transistor, the first transistor comprising a first gate electrode, a first source electrode, and a first drain electrode, the second transistor comprising a second gate electrode, a second source electrode, and second drain electrode; and the first gate electrode is conductively coupled to a first gate test pad, the first source electrode is conductively coupled to a first source test pad, the first drain electrode is conductively coupled to a first drain test pad, the second gate electrode is conductively coupled to a second gate test pad, the second source electrode is conductively coupled to a second source test pad, and the second drain electrode is conductively coupled to a second drain test pad.

Optionally, the first gate test pad and the second gate test pad are a common gate test pad.

Optionally, the first gate test pad and the second gate pad are a common gate test pad, and the first drain test pad and the second drain test pad are a common drain test pad.

Optionally, the first gate test pad and the second gate pad are a common gate test pad, and the first source test pad and the second source test pad are a common source test pad.

Optionally, the one or more test pixel circuits comprise an active layer, a first insulating layer, a first gate electrode layer, a second insulating layer, a second gate electrode layer, a third insulating layer, a source/drain electrode layer, a fourth insulating layer, a test electrode layer, and a fifth insulating layer sequentially stacked on a base substrate, wherein, for each of the plurality of transistors, a gate is located in the first gate electrode layer, a source and a drain are located in the source/drain electrode layer, the source/drain electrode layer has a gate connection pad and a source/drain connection pad, the gate connection pad is conductively coupled to the gate through a first via hole penetrating the third insulating layer and the second insulating layer, the second gate electrode layer has a second via hole for avoiding the gate connection pad, the source/drain connection pad is conductively coupled to the active layer through third via holes penetrating the third insulating layer, the second insulating layer, and the first insulating layer, the second gate electrode layer has fourth via holes for avoiding the source/drain connection pad, the test electrode layer has a gate test pad and a source/drain test pad, the gate test pad is conductively coupled to the gate connection pad through a fifth via hole penetrating the fourth insulating layer, the source/drain test pad is conductively coupled to the source/drain connection pad through sixth via holes penetrating the fourth insulating layer, and the fifth insulating layer has seventh and eighth via holes exposing the gate test pad and the source/drain test pad.

In the display panel, electrodes of a transistor to be detected are led out through electrode connection pads such that the electrodes of the transistor to be detected are respectively conductively coupled to electrode test pads through the electrode connection pads. As such, the electrical test device may be conductively coupled to the electrode test pads to electrically detect the transistor to be detected. Further, since the second via hole is formed in the second gate electrode layer, and the third insulating layer may both fill the second via hole and be in contact with the second insulating layer in a region covered by the second via hole, the third and second insulating layers in the region covered by the second via hole may be directly punched through. In this way, a process of exposing the electrodes of the transistor to be detected in the region covered by the second via hole is relatively simple and easy to implement. Further, since the electrode connection pads are respectively conductively coupled to the electrodes of the transistor to be detected, the electrode connection pads and the second gate electrode layer are also prevented from being short-circuited.

Optionally, each of the one or more test pixel circuits comprises a first switching transistor, a second switching transistor, a third switching transistor, a fourth switching transistor, a fifth switching transistor, a sixth switching transistor, a driving transistor, and a capacitor, wherein a gate of the driving transistor is conductively coupled to a first electrode of the capacitor and a drain of the first switching transistor, the drain of the first switching transistor is conductively coupled to a source of the second switching transistor, a source of the driving transistor is conductively coupled to a drain of the second switching transistor and a source of the fifth switching transistor, a drain of the driving transistor is conductively coupled to a drain of the third switching transistor and a drain of the fourth switching transistor, a second electrode of the capacitor is conductively coupled to a source of the fourth switching transistor, and a drain of the fifth switching transistor is conductively coupled to a drain of the sixth switching transistor.

Optionally, the non-display area is divided into a test area and a border area adjacent to the test area, and each of the one or more test pixel circuits and the plurality of environmental pixel circuits are located in the test area and/or the border area.

Another exemplary embodiment of the present disclosure provides a method for detecting electrical properties of the above display panel, the method comprising conductively coupling an electrical test device to at least one test pad, and controlling the electrical test device to perform an electrical test on the electrodes of a transistor conductively coupled to the at least one test pad.

In the method for detecting the display panel, since the electrodes of the transistor to be detected in the one or more test pixel circuits are led out through the at least one test pad, the electrical test device may be directly connected to the at least one test pad. As such, electrical testing of the electrodes of the transistor to be detected may be performed so as to realize automatic detection of the electrical properties of the transistor to be detected. In this way, the method for detecting the display panel may be implemented without any additional process prior to detection of the transistor to be detected, such that batch detection may be realized.

Optionally, the electrical test device comprises a flexible needle, and conductively coupling the electrical test device to the at least one test pad includes conductively coupling the needle to the at least one test pad.

The method for detecting the display panel may include the electrical test device being conductively coupled to the at least one test pad via the flexible needle. A small diameter and a soft material of the flexible needle may avoid test pad damage resulting from conventional hard needle detection methods.

Yet another exemplary embodiment of the present disclosure provides a method of manufacturing the above display panel, the method comprising forming each film layer of the display pixel circuit on the base substrate, forming each film layer of the one or more test pixel circuits on the base substrate, and forming the test pads respectively conductively coupled to the electrodes of the at least one of the plurality of transistors in the one or more test pixel circuits.

Optionally, forming each film layer of the one or more test pixel circuits on the base substrate forms each film layer of the plurality of environmental pixel circuits.

Optionally, forming each film layer of the one or more test pixel circuits on the base substrate comprises sequentially forming, on the base substrate, a pattern of the active layer, a pattern of the first insulating layer, a pattern of the first gate electrode layer, a pattern of the second insulating layer, and a pattern of the second gate electrode layer, where the second gate electrode layer includes the second via hole, forming, over the second gate electrode layer, the third insulating layer, forming, in a region covered by the second via hole of the second gate electrode layer, the first via hole penetrating the third insulating layer and the second insulating layer, and one of the third via holes penetrating the third insulating layer, the second insulating layer, and the first insulating layer, forming, in a region outside the second via hole of the second gate electrode layer, another one of the third via holes penetrating the third insulating layer, the second insulating layer, and the first insulating layer, forming, over the third insulating layer, a pattern of the source/drain electrode layer including the gate connection pad and the source/drain connection pad, where the gate connection pad is conductively coupled to gates of the at least one of the plurality of transistors, the gates being located in the first gate electrode layer, through the first via hole penetrating the third insulating layer and the second insulating layer, and the source/drain connection pad is conductively coupled to sources and drains of the at least one of the plurality of transistors, the sources and the drains being located in the source/drain electrode layer, through the third via holes penetrating the third insulating layer, the second insulating layer, and the first insulating layer, and forming the test pads respectively conductively coupled to the electrodes of the at least one of the plurality of transistors in the one or more test pixel circuits, comprising forming, over the source/drain electrode layer, the fourth insulating layer, forming the fifth and sixth via holes penetrating the fourth insulating layer and respectively exposing the gate connection pad and the source/drain connection pad, and forming, over the fourth insulating layer, a pattern of the test electrode layer, the test electrode layer including the gate test pad and the source/drain test pad, where the gate test pad is conductively coupled to the gate connection pad through the fifth via hole penetrating the fourth insulating layer, and the source/drain test pad is conductively coupled to the source/drain connection pad through the sixth via holes penetrating the fourth insulating layer.

Optionally, the pattern of the test electrode layer further includes an anode of the display area.

In the method of manufacturing the display panel, the electrodes of the transistor to be detected are led out through the electrode connection pads, such that the electrodes of the transistor to be detected are respectively conductively coupled to the electrode test pads through the electrode connection pads. As such, the electrical test device may be conductively coupled to the electrode test pads to electrically detect the transistor to be detected. Further since the second via hole is formed in the second gate electrode layer, and the third insulating layer may both fill the second via hole and be in contact with the second insulating layer in the region covered by the second via hole, the third and second insulating layers in the region covered by the second via hole may be directly punched through. In this way, the process of exposing the electrodes of the transistor to be detected in the region covered by the second via hole is relatively simple and easy to implement. Further, since the electrode connection pads are respectively conductively coupled to the electrodes of the transistor to be detected, the electrode connection pads and the second gate electrode layer are also prevented from being short-circuited.

Yet another embodiment of the present disclosure provides a display device including the above display device.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure. Additionally, the summary above does not constitute an admission that the technical problems and challenges discussed were known to anyone other than the inventors.

BRIEF DESCRIPTION OF THE FIGURES

In order to more clearly illustrate the technical solution provided by the embodiments of the present disclosure, a brief description of the drawings used in the detailed description of the embodiments is provided below. It will be understood that the drawings used in the following detailed description are only some of the embodiments of the present disclosure, and that those skilled in the art may obtain other drawings in light of the inventive concepts disclosed herein, without undue creative labor.

DETAILED DESCRIPTION

The following description relates to a display panel, preparation and detection methods thereof, and a display device including the display panel. The specific embodiments of the present invention will be described in detail below with reference to the accompanying figures. It is to be understood that the specific embodiments described herein are merely illustrative and not restrictive.

Exemplary embodiments of the display panel of the present disclosure will be described below with reference to FIGS. 1-7, 17, and 21.

Figure 1:
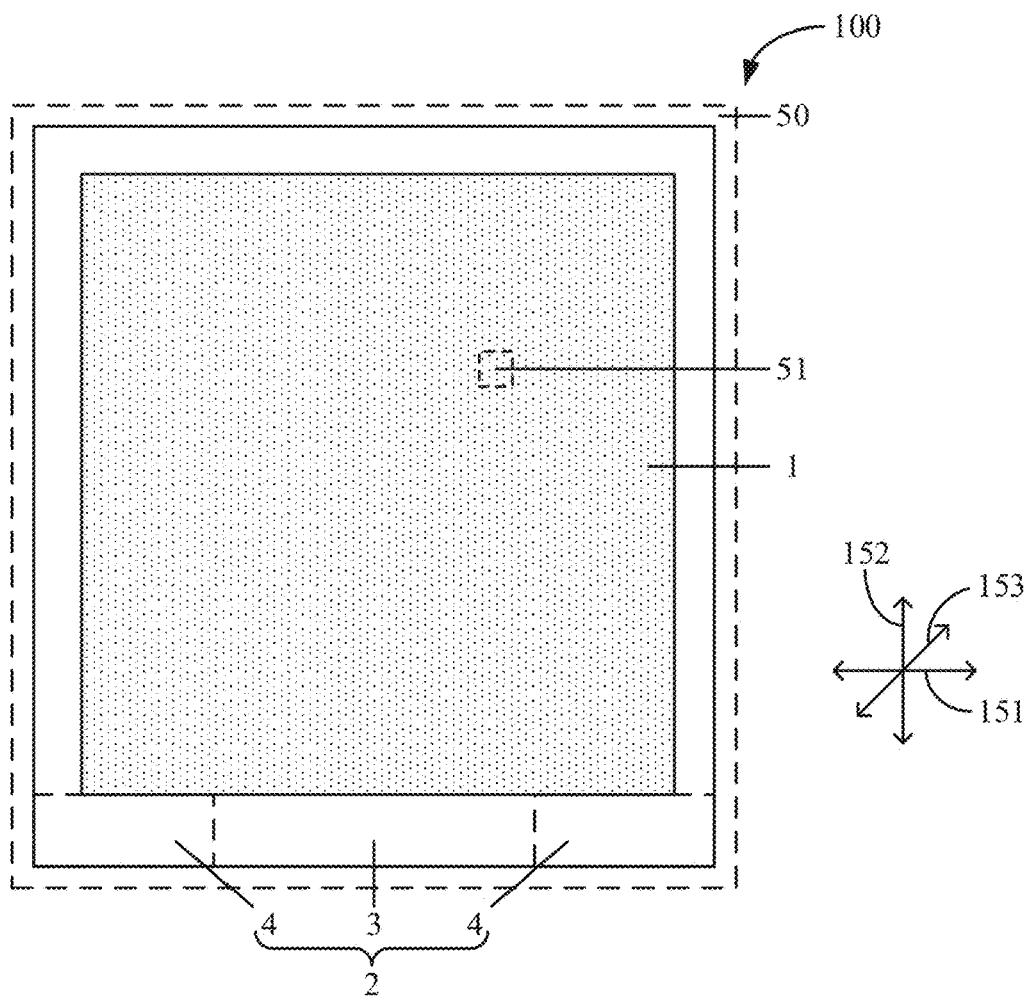
FIG. 1 shows a schematic structural diagram of a display panel, according to an embodiment of the present disclosure.

Referring now to FIG. 1, a schematic structural diagram 100 of a display panel 50 is depicted. In an exemplary embodiment, the display panel 50 has a display area 1 and a non-display area 2 surrounding the display area 1. Further, the display area 1 includes a plurality of display pixel circuits 51 respectively corresponding to a plurality of pixels, and the non-display area includes one or more test pixel circuits (as described below with reference to FIG. 2). It will be appreciated that in FIG. 1, mutually perpendicular axes 151, 152, and 153 define a three-dimensional space relative to the schematic structural diagram 100, where the axis 151 and the axis 152 define a plane of the schematic structural diagram 100 and the axis 153 is normal to the plane of the schematic structural diagram 100.

Figure 2:
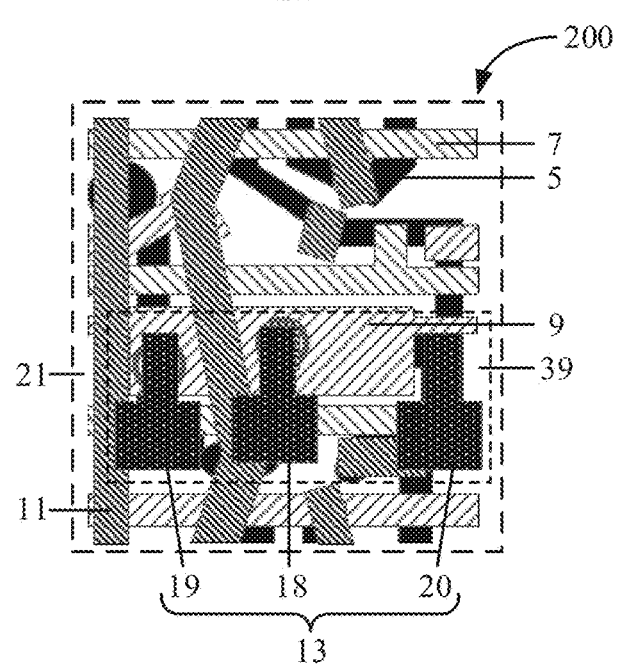
FIG. 2 shows a schematic top view of a test pixel circuit included in the display panel.

Referring now to FIG. 2, a schematic top view 200 of a test pixel circuit 21 for a display panel is depicted. In an exemplary embodiment, the display panel may be the display panel 50 described above with reference to FIG. 1. In such an example, the test pixel circuit 21 may have an equivalent circuit structure to a display pixel circuit (e.g., 51) included in a display area (e.g., 1) of the display panel (e.g., 50). Further, the display pixel circuit and the test pixel circuit 21 include a plurality of transistors (an exemplary embodiment of which is described below in detail with reference to FIG. 17), where electrodes of at least one of the plurality of transistors are respectively conductively coupled to different (e.g., separate and independent) test pads 13 (e.g., gate test pad 18, source test pad 19, and drain test pad 20) included in a test electrode layer 39.

It will be appreciated that various layers and other components of the display panel (e.g., 50) depicted in FIGS. 2-6, 9-14, and 21 with like ornamental patterning respectively correspond to the same layers and components. For example, each element having a cross-hatched pattern oriented from left to right in a downward direction with respect to FIGS. 2-6, 9-14, and 21 corresponds to the first gate electrode layer 7 and each element having a cross-hatched pattern oriented from right to left in a downward direction with respect to FIGS. 2-6, 9-14, and 21 corresponds to the second gate electrode layer 9.

In the display panel (e.g., 50), the non-display area (e.g., 2) includes the test pixel circuit 21 having the same circuit structure as the display pixel circuit (e.g., 51), that is, a portion of the plurality of transistors in the test pixel circuit 21 are conductively coupled in a manner such that electrical properties of a portion of the plurality of transistors in the display pixel circuit in the display area (e.g., 1) may be simulated, as the electrical properties of the portion of the plurality of transistors in the test pixel circuit 21 are substantially similar to the electrical properties of the portion of the plurality of transistors in the display pixel circuit. In this way, the electrical properties of the portion of the plurality of transistors in the test pixel circuit 21 may characterize the electrical properties of the portion of the plurality of the transistors in the display pixel circuit, and an accuracy of detecting the electrical properties of the plurality of transistors as a whole may be improved. Further, since electrodes of at least one of the plurality of transistors may be respectively coupled to different test pads 13, each electrode of the at least one of the plurality of transistors may be electrically tested by using an electrical test device (as described below with reference to FIG. 3) without any additional process, such that batch detection may be realized.

Figure 3:
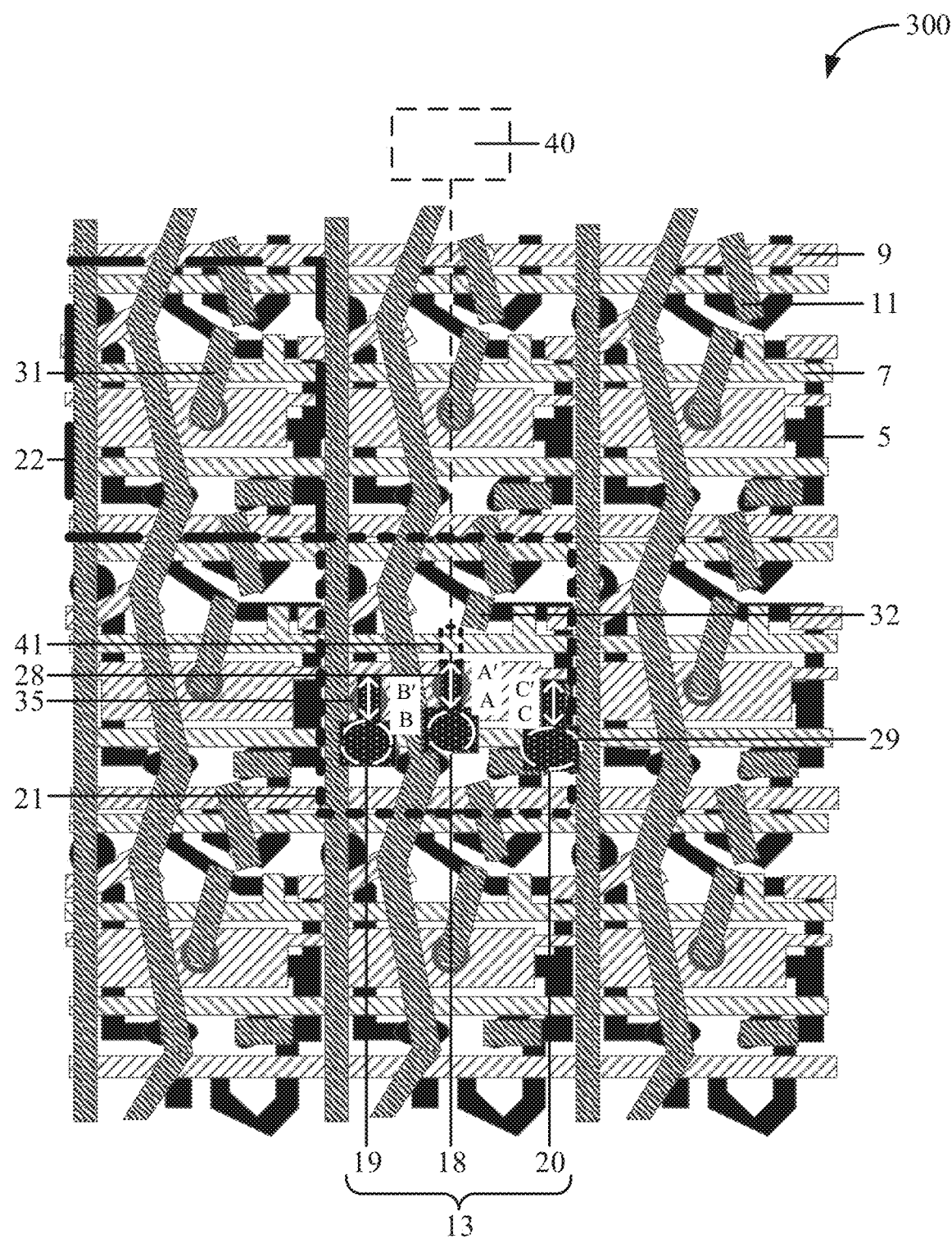
FIG. 3 shows a schematic top view of the test pixel circuit surrounded by eight environmental pixel circuits.

Referring now to FIG. 3, a schematic top view 300 of the test pixel circuit 21 for a display panel is depicted. In an exemplary embodiment, the display panel may be the display panel 50 described above with reference to FIG. 1. Optionally, in the display panel, the non-display area (e.g., 2) includes a plurality of environmental pixel circuits 22, each of the plurality of environmental pixel circuits 22 having an equivalent circuit structure to the display pixel circuit (e.g., 51), and the plurality of environmental pixel circuits 22 surrounds at least one of the one or more test pixel circuits 21.

The display panel (e.g., 50) may further include a plurality of environmental pixel circuits 22 surrounding the one or more test pixel circuits 21 in the non-display area (e.g., 2), such that an environmental condition of the display pixel circuit (e.g., 51) may be realistically simulated, that is, such that the portion of the plurality of transistors in the one or more test pixel circuits 21 may accurately represent the portion of the plurality of transistors in the display pixel circuit. In this way, an electrical test may be performed on the electrodes of the portion of the plurality of transistors in the one or more test pixel circuits 21 (e.g., via an electrical test device 40), and results of the electrical test may accurately reflect the electrical properties of the portion of the plurality of transistors in the display pixel circuit, thereby improving the accuracy of detecting the electrical properties of the plurality of transistors as a whole.

Optionally, in the display panel (e.g., 50), each of the one or more test pixel circuits 21 is surrounded by eight of the plurality of environmental pixel circuits 22, such that any one of the one or more test pixel circuits 21 and a corresponding eight surrounding environmental pixel circuits 22 are arranged in a 3×3 array, and the one of the one or more test pixel circuits 21 included in the 3×3 array is located at a center of the 3×3 array.

Optionally, in the display panel (e.g., 50), the one or more test pixel circuits 21 may include one or more 3×3 arrays of test pixel circuits 21, where each of the one or more 3×3 arrays of test pixel circuits 21 is surrounded by sixteen of the environmental pixel circuits 22, such that any one of the 3×3 arrays of test pixel circuits 21 and a corresponding sixteen surrounding environmental pixel circuits 22 are arranged in a 5×5 array, and the one of the one or more 3×3 arrays of test pixel circuits included in the 5×5 array is located at a center of the 5×5 array. In such examples, individual test pixel circuits 21 in the 3×3 array of test pixel circuits 21 may also function as environmental pixel circuits 22.

It will be appreciated that any one of the one or more test pixel circuits 21 may alternatively be surrounded by more than eight environmental pixel circuits 22. That is, as long as a given test pixel circuit 21 is surrounded by the environmental pixel circuits 22, the environment of the display pixel circuit (e.g., 51) may be simulated, such that the electrical properties of the portion of the transistors in the one or more test pixel circuits 21 may accurately represent the electrical properties of the portion of the transistors in the display pixel circuit.

Optionally, electrodes of each of the plurality of transistors included in the one or more test pixel circuits 21 are respectively conductively coupled to different test pads 13. As such, electrical detection may be performed on each transistor included in a given test pixel circuit 21.

Optionally, the one or more test pixel circuits 21 include a plurality of test pixel circuits 21, and a number of the plurality of test pixel circuits 21 may be equal to a number of the plurality of transistors included in the plurality of test pixel circuits 21. As such, electrodes of each different one of the plurality of transistors respectively included in each of the plurality of test pixel circuits 21 are respectively conductively coupled to different test pads 13. That is, in some examples, the non-display area (e.g., 2) of the display panel (e.g., 50) may include a plurality of test pixel circuits 21. Further, for electrical detection of each of the portion of the plurality of transistors in the display pixel circuit (e.g., 51), a corresponding plurality of test pixel circuits 21 may be provided, such that each of the plurality of test pixel circuits enables electrical detection of only one of the plurality of transistors, and that each of the plurality of transistors to be detected are different and in respective different test pixel circuits 21. Further, in such examples wherein a different one of the plurality of test pixel circuits 21 is conductively coupled to a different test pad 13, it will be appreciated that more test pixel circuits 21 may be provided according to a given application, providing that the number of the plurality of test pixel circuits 21 is not less than a number of the portion of the plurality of transistors in the display pixel circuit.

Optionally, an electrical test device 40 is conductively coupled to at least one test pad 13. In the example shown at FIG. 3, the electrical test device 40 is conductively coupled to the gate test pad 18 via a flexible needle 41 composed of a soft material (e.g., simulating a bull hair). In this way, the electrical test device 40 may be employed to detect electrical properties of electrodes of a given transistor.

Figure 4:
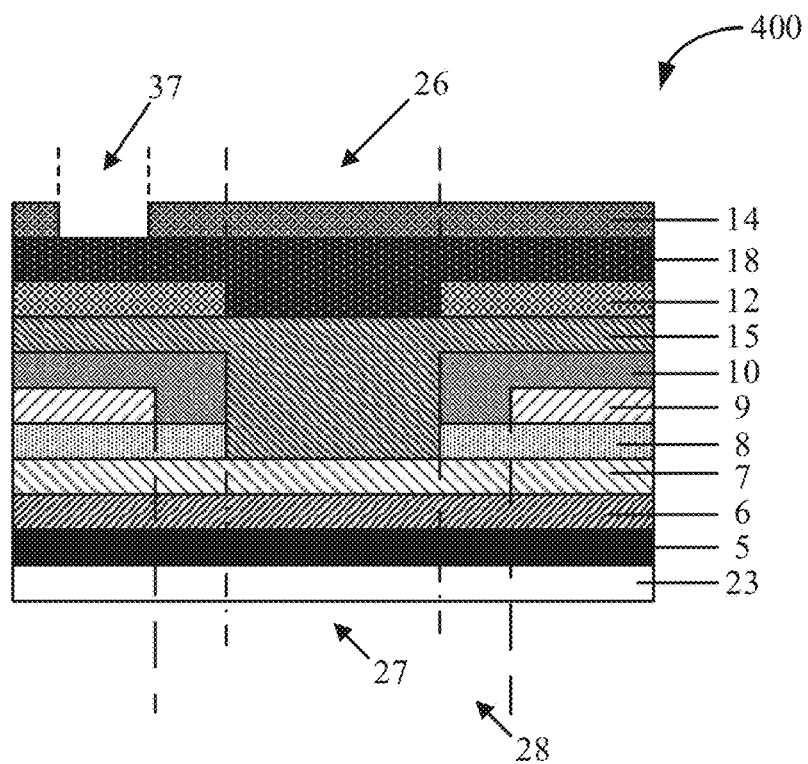
FIG. 4 shows a first schematic cross-section of the test pixel circuit of FIGS. 2 and 3.
Figure 5:
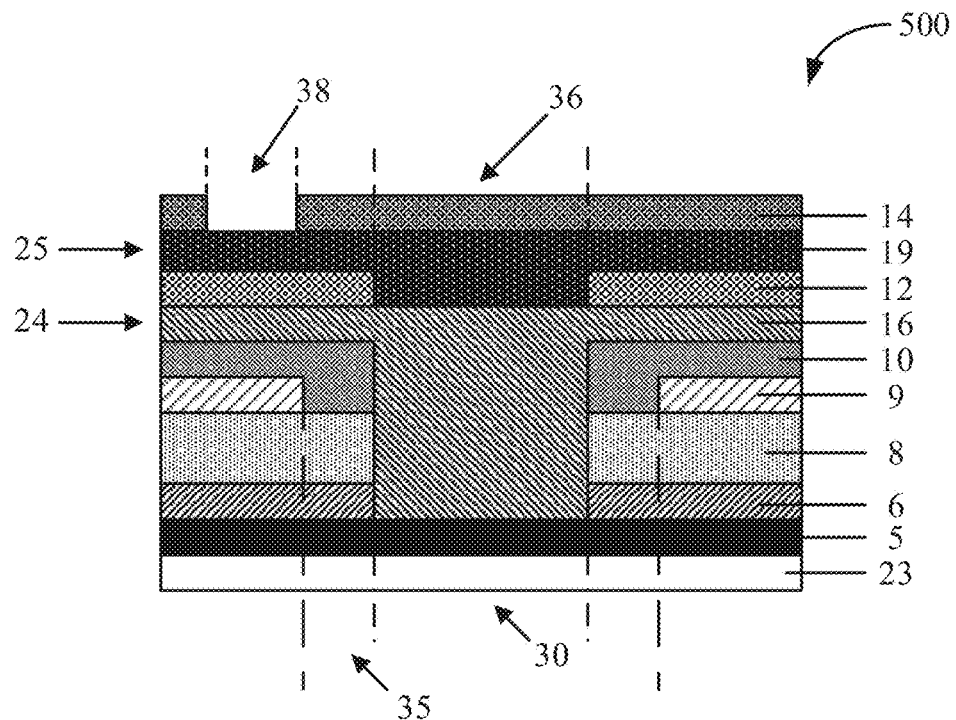
FIG. 5 shows a second schematic cross-section of the test pixel circuit of FIGS. 2 and 3.
Figure 6:
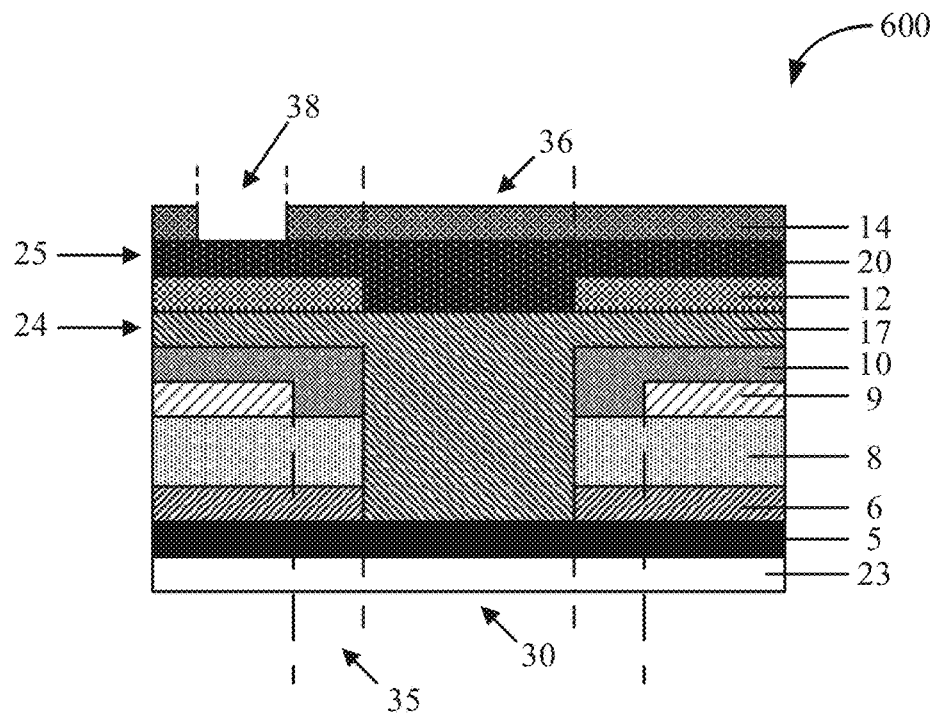
FIG. 6 shows a third schematic cross-section of the test pixel circuit of FIGS. 2 and 3.

Referring now to FIGS. 2-6, schematic cross-sections 400, 500, and 600 of the test pixel circuit 21 of FIGS. 2 and 3 are depicted in FIGS. 4, 5, and 6, respectively. Optionally, the test pixel circuit 21 may include the active layer 5, the first insulating layer 6, the first gate electrode layer 7, the second insulating layer 8, the second gate electrode layer 9, the third insulating layer 10, the source/drain electrode layer 11, the fourth insulating layer 12, the test electrode layer 39 (including test pads 13), and the fifth insulating layer 14 sequentially stacked on a base substrate 23.

For each of the plurality of transistors in the test pixel circuit 21, the gate is located in the first gate electrode layer 7, and the source and the drain (also referred to herein as a "source/drain") are located in the source/drain layer 11.

Further, for each of the plurality of transistors in the test pixel circuit 21, the source/drain electrode layer 11 has the gate connection pad 15 and the source/drain connection pad 24, the gate connection pad 15 is conductively coupled to the gate through the first via hole 27 penetrating each of the third insulating layer 10 and the second insulating layer 8, the second gate electrode layer 9 has the second via hole 28 for avoiding the gate connection pad 15, the source/drain connection pad 24 is conductively coupled to the source and drain through third via holes 30 penetrating each of the third insulating layer 10, the second insulating layer 8, and the first insulating layer 6, and the second gate electrode layer 9 has the fourth via holes 35 for avoiding the source/drain connection pad 24. In some examples, the second via hole 28 and the fourth via holes 35 may be the same via hole.

Further, for each of the plurality of transistors in the test pixel circuit 21, the test electrode layer 39 has the gate test pad 18 and the source/drain test pad 25, the gate test pad 18 is conductively coupled to the gate connection pad 15 through the fifth via hole 26 penetrating the fourth insulating layer 12, the source/drain test pad 25 is conductively coupled to the source/drain connection pad 24 through sixth via holes 36 penetrating the fourth insulating layer 12, and the fifth insulating layer 14 has the seventh via hole 37 exposing the gate test pad 18 and the eighth via holes 38 exposing the source/drain test pad 25. In some examples, the fifth via hole 26 and the sixth via holes 36 may be the same via hole. In some examples, the seventh via hole 37 and the eighth via holes 38 may be the same via hole.

In the display panel (e.g., 50), electrodes of a transistor to be detected are led out through electrode connection pads (e.g., gate connection pad 15 and source/drain connection pad 24) such that the electrodes of the transistor to be detected are respectively conductively coupled to electrode test pads (e.g., gate test pad 18 and source/drain test pad 25) through the electrode connection pads. As such, the electrical test device 40 may be conductively coupled to the electrode test pads to electrically detect the transistor to be detected. Further, since the second via hole 28 is formed in the second gate electrode layer 9, and the third insulating layer 10 may both fill the second via hole 28 and be in contact with the second insulating layer 8 in a region covered by the second via hole 28, the third insulating layer 10 and second insulating layer 8 in the region covered by the second via hole 28 may be directly punched through. In this way, a process of exposing the electrodes of the transistor to be detected in the region covered by the second via hole 28 is relatively simple and easy to implement. Further, since the electrode connection pads are respectively conductively coupled to the electrodes of the transistor to be detected, the electrode connection pads and the second gate electrode layer 9 are also prevented from being short-circuited.

It will be appreciated that, if the via holes of the source/drain connection pad and the via holes of the gate connection pad are not disposed in the second gate electrode layer, then the second gate electrode layer blocks the gate and the source/drain of the transistor from being detected. In such an example, when conductively coupling an electrode to be detected through the electrode connection pads (e.g., gate and source/drain connection pads) after the third insulating layer is formed, the second gate electrode layer cannot be penetrated directly from a via hole through the third insulating layer. Even if an additional process first forms such a via hole in the third insulating layer and then forms a via hole in the second gate electrode layer, the source/drain electrode layer at the via hole will be short-circuited with the second gate electrode layer.

However, in the display panel (e.g., 50) of the present disclosure, since the second gate electrode layer 9 is provided with the fourth via holes 35 for avoiding the source/drain connection pad 24 and the second via hole 28 for avoiding the gate connection pad 15, the third insulating layer 10 fills each of the fourth via holes 35 and the second via hole 28. As a result, a process of exposing the electrodes to be detected in a region covered by the fourth via holes 35 and the second via hole 28 is relatively simple and easy to implement, and the electrode connection pad (e.g., gate connection pad 15 and source/drain connection pad 24) and the second gate electrode layer 9 are also prevented from being short-circuited.

As an example, in FIG. 3, the second gate electrode layer 9 of the test pixel circuit 21 is shown having the second via hole 28 for the gate test pad 18 and one of the fourth via holes 35 for the source test pad 19 (where the source test pad 19 may be one component of the source/drain test pad 25, as discussed below). However, it will be appreciated that, in specific implementations, a number and location of via holes may be selected according to a positional relationship between the electrodes of the transistor to be detected and the second gate electrode layer 9.

It will be further appreciated that, in order to facilitate display of the active layer 5 and positional relationships of the various electrode layers (e.g., 7, 9, 11, 39), the various insulating layers (e.g., 6, 8, 10, 12, 14) are not shown in the schematic top view 200 and the schematic structural diagram 300 of FIGS. 2 and 3, respectively. Further, the test electrode layer 39 is not shown in FIG. 3 in order to facilitate display of the gate test pad 18, the source test pad 19, and the drain test pad 20.

In examples wherein the non-display area (e.g., 2) includes the plurality of environmental pixel circuits 22, one or more film layers of the environmental pixel circuits 22 surrounding the test pixel circuit 21 may be selectively formed with one or more film layers of the test pixel circuit 21, such that the environmental pixel circuits 22 may not be provided with the test electrode layer 39 (which may be formed in the test pixel circuit 21 later, for example). As such, a given environmental pixel circuit 22 includes the active layer 5, the first insulating layer 6, the first gate electrode layer 7, the second insulating layer 8, the second gate electrode layer 9, the third insulating layer 10, the source/drain electrode layer 11, the fourth insulating layer 12, and the fifth insulating layer 14 sequentially stacked on the base substrate 23.

In an exemplary embodiment, the display panel (e.g., 50) includes conductively coupling each electrode of any one of the transistors in the test pixel circuit 21 to a corresponding one of the test pads 13 and, as an example, the gate, the source, or the drain of the given transistor may be detected. Further, the source/drain connection pad 24 includes the source connection pad 16 and the drain connection pad 17. Further, the test electrode layer 39 includes the test pads 13, the test pads 13 including the gate test pad 18 and a source/drain test pad 25, the source/drain test pad 25 including the source test pad 19 and the drain test pad 20. Further, the schematic cross-section 400 is taken along line AA' of FIG. 3, the schematic cross-section 500 is taken along line BB' of FIG. 3, and the schematic cross-section 600 is taken along line CC' of FIG. 3.

As shown in FIG. 4, the base substrate 23, the active layer 5, the first insulating layer 6, the first gate electrode layer 7, the second insulating layer 8, the second gate electrode layer 9, the third insulating layer 10, the gate connection pad 15, the fourth insulating layer 12, the gate test pad 18, and the fifth insulating layer 14 are sequentially stacked. The gate connection pad 15 is conductively coupled to the gate of the transistor to be detected in the first gate electrode layer 7 through the first via hole 27 penetrating the third insulating layer 10 and the second insulating layer 8, where the second gate electrode layer 9 has the second via hole 28 for avoiding the gate connection pad 15. Further, the gate test pad 18 is conductively coupled to the gate connection pad 15 through the fifth via hole 26 penetrating the fourth insulating layer 12. Additionally, the fifth insulating layer 14 includes the seventh via hole 37 for exposing the gate test pad 18.

As shown in FIG. 5, the base substrate 23, the active layer 5, the first insulating layer 6, the second insulating layer 8, the second gate electrode layer 9, the third insulating layer 10, the source connection pad 16, the fourth insulating layer 12, the source test pad 19, and the fifth insulating layer 14 are sequentially stacked. The source connection pad 16 is conductively coupled to each of a source of the transistor to be detected and the active layer 5 through one of the third via holes 30 penetrating the third insulating layer 10, the second insulating layer 8, and the first insulating layer 6, where the second gate electrode layer 9 has one of the fourth via holes 35 for avoiding the source connection pad 16. Further, the source test pad 19 is conductively coupled to the source connection pad 16 through one of the sixth via holes 36 penetrating the fourth insulating layer 12. Additionally, the fifth insulating layer 14 includes one of the eighth via holes 38 for exposing the source test pad 19.

As shown in FIG. 6, the base substrate 23, the active layer 5, the first insulating layer 6, the second insulating layer 8, the second gate electrode layer 9, the third insulating layer 10, the drain connection pad 17, the fourth insulating layer 12, the drain test pad 20, and the fifth insulating layer 14 are sequentially stacked. The drain connection pad 17 is conductively coupled to each of a drain of the transistor to be detected and the active layer 5 through another one of the third via holes 30 penetrating the third insulating layer 10, the second insulating layer 8, and the first insulating layer 6, where the second gate electrode layer 9 has one of the fourth via holes 35 for avoiding the drain connection pad 17. Further, the drain test pad 20 is conductively coupled to the drain connection pad 17 through one of the sixth via holes 36 penetrating the fourth insulating layer 12. Additionally, the fifth insulating layer 14 includes one of the eighth via holes 38 for exposing the drain test pad 20.

It will be appreciated that, in one specific implementation of the display panel (e.g., 50), positions of the seventh via hole 37 and the eighth via holes 38 penetrating the fifth insulating layer 14 may be selected according to patterns of the test pads 13 in the test electrode layer 39. For example, a via hole penetrating the fifth insulating layer 14 may be formed in a region aligned with region 29 in FIG. 3 to expose a given test pad 13.

It will be appreciated that, in one specific implementation of the display panel (e.g., 50), positions of the seventh via hole 37 and the eighth via holes 38 penetrating the fifth insulating layer 14 may be selected according to patterns of the test pads 13 in the test electrode layer 39. For example, a via hole penetrating the fifth insulating layer 14 may be formed in a region aligned with region 29 in FIG. 3 to expose a given test pad 13.

In some examples, the display panel (e.g., 50) may be an organic light-emitting diode (OLED) display panel, where each display pixel circuit (e.g., 51) is used to drive OLED light. More specifically, in each display pixel circuit of the display panel, each of the first insulating layer 6 and the second insulating layer 8 may be, for example, a gate insulator (GI), the third insulating layer 10 may be, for example, an interlayer dielectric insulating layer (ILD), the fourth insulating layer 12 may be, for example, a planarization layer (PLN), and the fifth insulating layer 14 may be, for example, a pixel definition layer (PDL).

Figure 17:
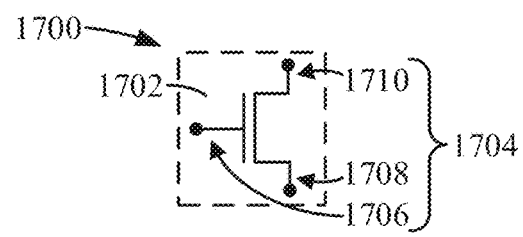
FIG. 17 shows a schematic circuit diagram of an example transistor included in the display panel.

Referring now to FIG. 17, a schematic circuit structure 1700 of an example transistor 1702 is depicted. In some embodiments, the transistor 1702 may be any transistor of the plurality of transistors described above with reference to FIGS. 2-6. That is, in some embodiments, each of the plurality of transistors may have an equivalent circuit structure of the transistor 1702. The transistor 1702 may include three electrodes 1704, specifically, a gate 1706, a source 1708, and a drain 1710. As such, the transistor 1702 may be conductively coupled to the test pixel circuit (e.g., 21). Specifically, the gate 1706 may be conductively coupled to the gate test pad (e.g., 18) via the gate connection pad (e.g., 15), the source 1708 may be conductively coupled to the source test pad (e.g., 19) via the source connection pad (e.g., 16), and the drain 1710 may be conductively coupled to the drain test pad (e.g., 20) via the drain connection pad (e.g., 17). In this way, electrical properties of the electrodes 1704 of the transistor 1702 may be detected by conductively coupling an electrical test device (e.g., 40) to the test pads of the test pixel circuit.

Figure 7:
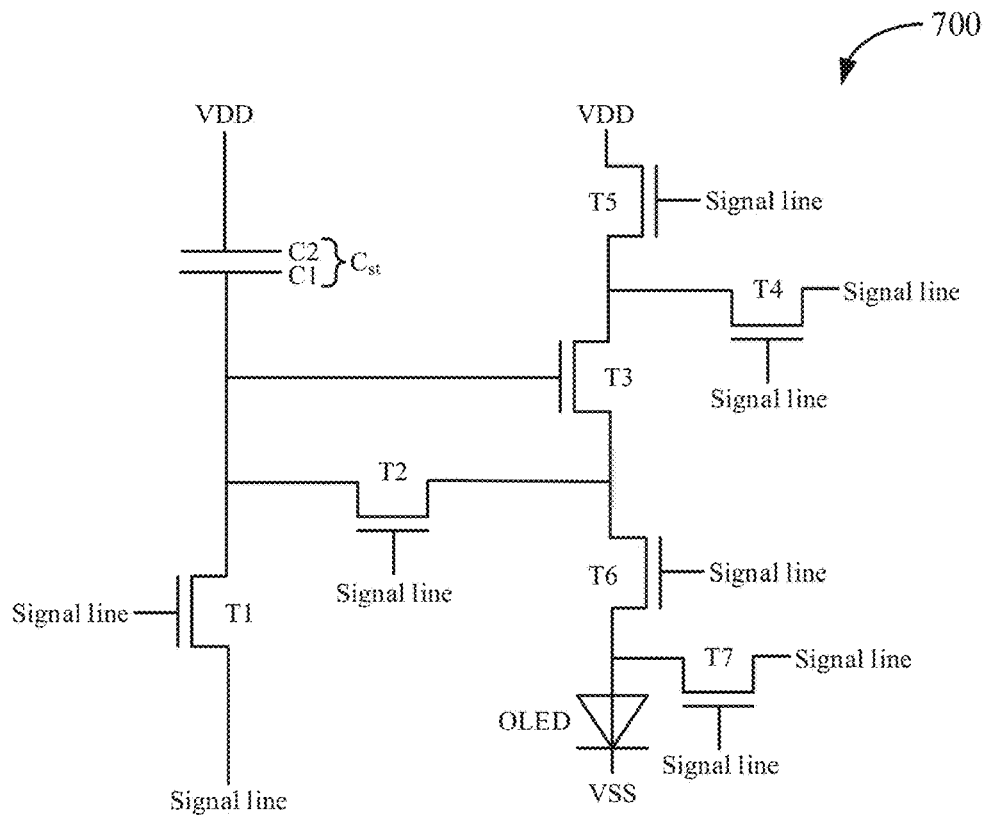
FIG. 7 shows a schematic circuit diagram of a display pixel circuit included in the display panel.

Referring now to FIG. 7, a schematic circuit structure 700 of a display pixel circuit is depicted. In some embodiments, the display pixel circuit may be the display pixel circuit 51 included in the display panel 50 as described above with reference to FIG. 1. Further, because the test pixel circuit (e.g., test pixel circuit 21, as described above with reference to FIGS. 2-6) may have an equivalent circuit structure to the display pixel circuit, the schematic circuit structure 700 may also, in some examples, correspond to the test pixel circuit. Thus, in each display pixel circuit, transistors and capacitors may be conductively coupled via power lines in the same pattern as shown in the schematic circuit structure 700 for the test pixel circuit. In this way, the test pixel circuit may emulate operation of the display pixel circuit for electrical testing purposes.

In an exemplary embodiment, the display panel (e.g., 50) has a stacked configuration of the active layer (e.g., 5), the first insulating layer (e.g., 6), the first gate electrode layer (e.g., 7), the second insulating layer (e.g., 8), the second gate electrode layer (e.g., 9), the third insulating layer (e.g., 10), and the source/drain electrode layer (e.g., 11) to form the test pixel circuit (e.g., 21), and the test pixel circuit further includes a first switching transistor T1, a second switching transistor T2, a driving transistor T3, a third switching transistor T4, a fourth switching transistor T5, a fifth switching transistor T6, a sixth switching transistor T7, and a capacitor $C_{st}$. A gate of the driving transistor T3 is conductively coupled to each of a first electrode C1 of the capacitor $C_{st}$ and a drain of the first switching transistor T1. The drain of the first switching transistor T1 is conductively coupled to a source of the second switching transistor T2. A source of the driving transistor T3 is conductively coupled to each of a drain of the second switching transistor T2 and a source of the fifth switching transistor T5. A drain of the driving transistor T3 is conductively coupled to each of a drain of the third switching transistor T4 and a drain of the fourth switching transistor T5. A second electrode C2 of the capacitor $C_{st}$ is conductively coupled to a source of the fourth switching transistor T5. A drain of the fifth switching transistor T6 is conductively coupled to a drain of the sixth switching transistor T7.

Further, since the display pixel circuit (e.g., 51) has the same circuit structure as the test pixel circuit (e.g., 21), the display pixel circuit also includes an active layer (forming a transistor and a capacitor), a first insulating layer, a first gate electrode layer, a second insulating layer, a second gate electrode layer, a third insulating layer, and a source/drain electrode layer.

Further, the display pixel circuit (e.g., 51) also includes the first switching transistor T1, the second switching transistor T2, the driving transistor T3, the third switching transistor T4, the fourth switching transistor T5, the fifth switching transistor T6, the sixth switching transistor T7, and the capacitor $C_{st}$. The gate of the driving transistor T3 is conductively coupled to each of the first electrode C1 of the capacitor $C_{st}$, the drain of the first switching transistor T1, and the source of the second switching transistor T2. The source of the driving transistor T3 is conductively coupled to each of the drain of the second switching transistor T2 and the source of the fifth switching transistor T5. The drain of the driving transistor T3 is conductively coupled to each of the drain of the third switching transistor T4 and the drain of the fourth switching transistor T5. The second electrode C2 of the capacitor $C_{st}$ is conductively coupled to the source of the fourth switching transistor T5 via a power line VDD (also referred to as a "voltage drain drain" power line). The drain of the fifth switching transistor T6 is conductively coupled to the drain of the sixth switching transistor T7.

Further, each of a gate and a source of the first switching transistor T1, a gate of the second switching transistor T2, a source and a gate of the third switching transistor T4, a gate of the fourth switching transistor T5, a gate of the fifth switching transistor T6, and a source and a gate of the sixth switching transistor T6 are respectively conductively coupled to different signal lines. In the display pixel circuit (e.g., 51), the drain of the fifth switching transistor T6 is also conductively coupled to an anode of an organic light-emitting diode (OLED). A cathode of the OLED is conductively coupled to a power line VSS (also referred to as a "voltage source source" power line). The display pixel circuit further includes a fourth insulating layer above the source/drain electrode layer, where the anode, the cathode, and a light-emitting layer of the OLED are above the fourth insulating layer. As such, the display panel (e.g., 50) may be, for example, an OLED display panel.

In an exemplary embodiment of the display panel (e.g., 50), the display pixel circuit (e.g., 51) and the test pixel circuit (e.g., 21) respectively including seven capacitors and one capacitors. In a specific implementation, numbers of transistors and capacitors in the display pixel circuit for driving the OLED to emit light and the circuit structure may be designed according to a given application, as long as the circuit structures of the test pixel circuit and the display pixel circuit remain the same. In this way, the electrical properties of the portion of the plurality of transistors in the test pixel circuit may characterize the electrical properties of the portion of the plurality of transistors in the display pixel circuit, which may improve the accuracy of detecting the electrical properties of a given transistor therein.

In an exemplary embodiment of the display panel (e.g., 50), electrodes (e.g., the gate, source, and drain) of the driving transistor T3 are conductively coupled to respective test pads (e.g., 13). Further, a connection mode of each transistor and capacitor in a given environmental pixel circuit (e.g., 22) may be the same as a respective connection mode of each transistor and capacitor of the display pixel circuit (e.g., 51), such that the schematic circuit structure 700 may also, in some examples, correspond to the environmental pixel circuit.

Referring now to FIGS. 3 and 7, in the environmental pixel circuit 22, the gate of the driving transistor T3 and the source of the second switching transistor T2 are conductively coupled via a connection line 31 in the source/drain electrode layer 11. In the test pixel circuit 21, to detect electrical properties of the driving transistor T3, the gate connection pad 15 is conductively coupled to the gate of the driving transistor T3, the source connection pad 16 is conductively coupled to the source of the driving transistor T3, and the drain connection pad 17 is conductively coupled to the drain of the driving transistor T3. Thus, unlike the connection mode of the environmental pixel circuit 22, the gate connection pad 15 is disconnected from a connection line 32 leading to the source of the second switching transistor T2, and the test pads 13 are respectively conductively coupled to the gate connection pad 15, the source connection pad 16, and the drain connection pad 17. In this way, detection of the electrical properties of the driving transistor T3 may be achieved.

Figure 21:
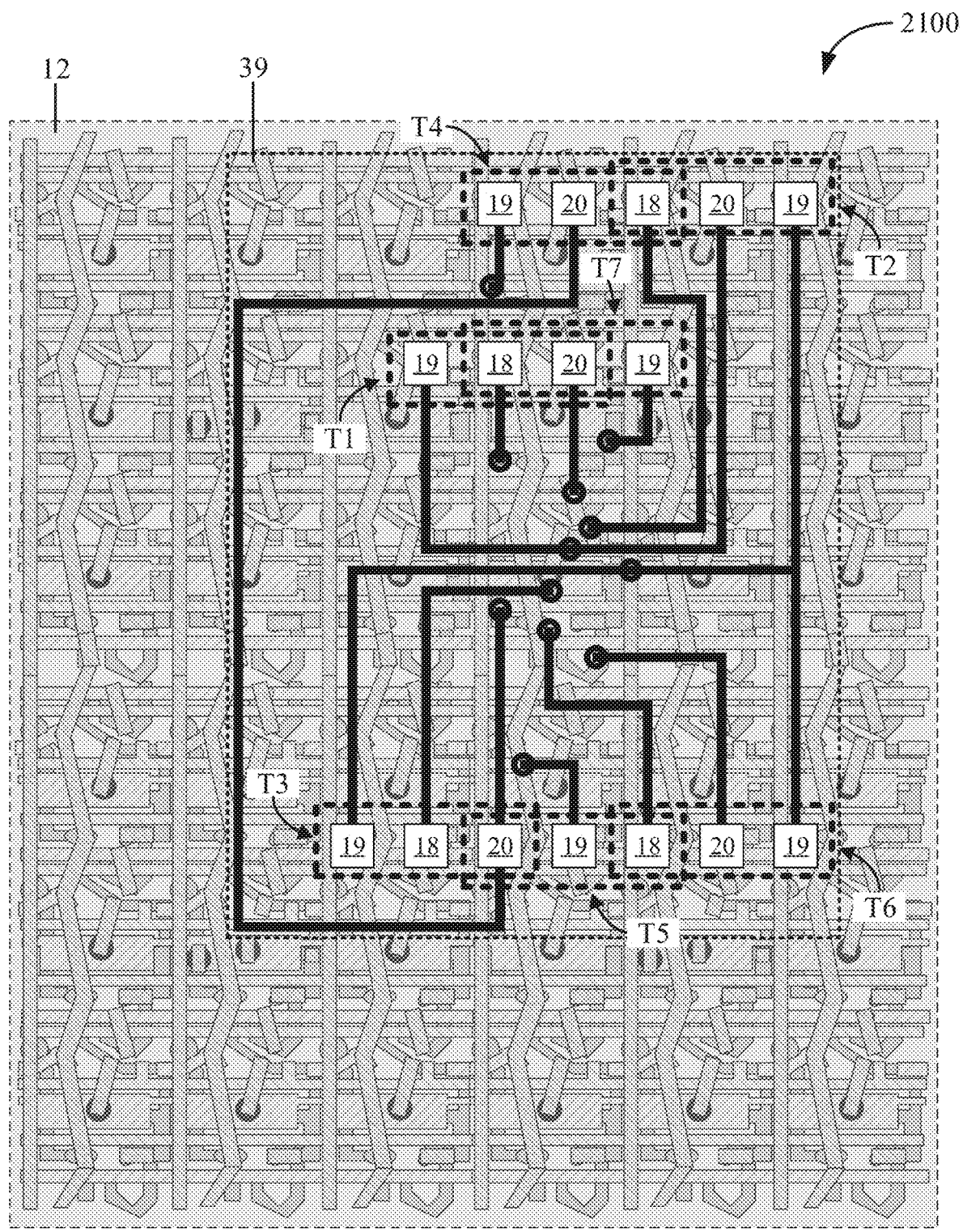
FIG. 21 shows a schematic diagram of an exemplary circuit structure as implemented in a test electrode layer of the display panel.

Referring now to FIG. 21, a schematic diagram 2100 of an exemplary circuit structure included in the test electrode layer 39 of the test pixel circuit (e.g., test pixel circuit 21, as described above with reference to FIGS. 2-6) is depicted. As shown, the various test pads (e.g., 13) of the test electrode layer 39 may be conductively coupled to connection pads below the fourth insulating layer 12 by way of respective via holes. Further, a fifth insulating layer (e.g., 14) may be formed over the test electrode layer 39 having respective via holes exposing each of the various test pads.

Each of the first switching transistor T1, the second switching transistor T2, the driving transistor T3, the third switching transistor T4, the fourth switching transistor T5, the fifth switching transistor T6, and the sixth switching transistor T7 may respectively include a gate electrode, a source electrode, and a drain electrode. Further, each respective gate electrode may be conductively coupled to a respective gate test pad 18, each respective source electrode may be conductively coupled to a respective source test pad 19, and each respective drain electrode may be conductively coupled to a respective drain test pad 20.

Individual test pads (e.g., 13) may be shared between pairs of transistors. As a first example, each of the first switching transistor T1 and the sixth switching transistor T7 may be conductively coupled to a common gate test pad 18 and a common drain test pad 20. As a second example, each of the second switching transistor T2 and the third switching transistor T4 may be conductively coupled to a common gate test pad 18. As a third example, each of the driving transistor T3 and the fourth switching transistor T5 may be conductively coupled to one drain test pad 20. As a fourth example, each of the fourth switching transistor T5 and the fifth switching transistor T6 may be conductively coupled to a common gate test pad 18.

As further shown, the transistors may be included within groups of transistors (e.g., single gate or double gate TFTs). Specifically, a first group of transistors may include the driving transistor T3, the fourth switching transistor T5, and the fifth switching transistor T6, a second group of transistors may include the first switching transistor T1 and the sixth switching transistor T7, and a third group of transistors may include the second switching transistor T2 and the third switching transistor T4.

Referring now to FIG. 1, optionally, the non-display area 2 is divided into one or more test areas 4 and a border area 3 (also referred to as a bezel area 3) adjacent to the one or more test areas 4. Each of the one or more test pixel circuits (e.g., 21) and the plurality of environmental pixel circuits (e.g., 22) are located in the test area 4 and/or the border area 3.

It will be appreciated that, in the display panel 50, an area where the one or more test pixel circuits (e.g., 21) and the plurality of environmental pixel circuits (e.g., 22) are disposed may be selected according to a given application.

Based on the exemplary embodiments of the display panel of the present disclosure described with reference to FIGS. 1-7, 17, and 21, an exemplary embodiment of the method for detecting the display panel of the present disclosure will be described below with reference to FIG. 15.

Figure 15:
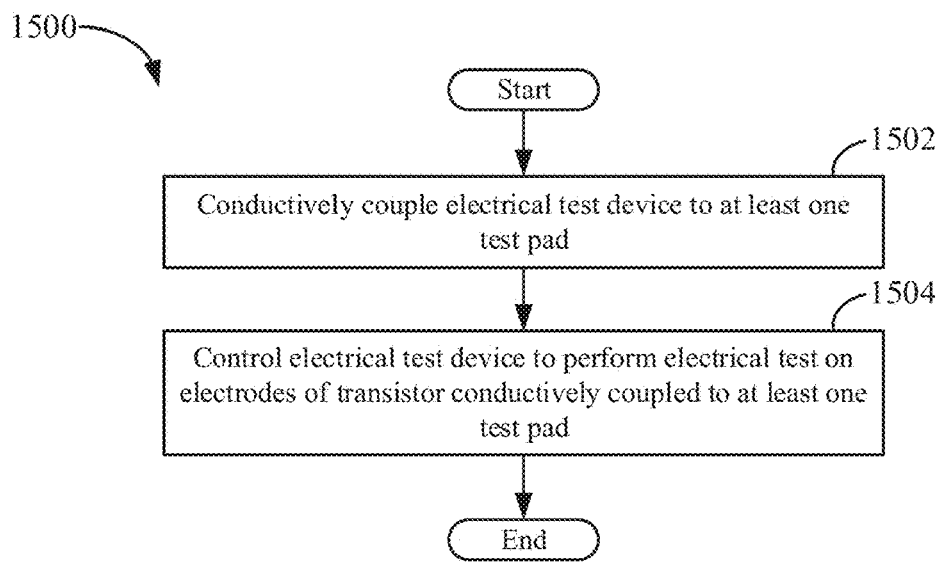
FIG. 15 shows a flow diagram of a method of detecting electrical properties of the display panel, according to an embodiment of the present disclosure.

Referring now to FIG. 15, a flow diagram 1500 of a method of detecting a display panel is depicted. The display panel may be the display panel 50 described above with reference to FIGS. 1-7, 17, and 21. As such, components described with reference to FIG. 15 may be examples of corresponding components of the display panel 50 of FIGS. 1-7, 17, and 21.

At 1502, the electrical test device (e.g., 40) may be conductively coupled to at least one test pad (e.g., 13).

At 1504, the electrical test device (e.g., 40) may be controlled to perform an electrical test on electrodes of a given transistor conductively coupled to the at least one test pad (e.g., 13).

In the method for detecting the display panel (e.g., 50), since the electrodes of the transistor to be detected in the one or more test pixel circuits (e.g., 21) are led out through the at least one test pad (e.g., 13), the electrical test device (e.g., 40) may be directly connected to the at least one test pad. As such, electrical testing of the electrodes of the transistor to be detected may be performed so as to realize automatic detection of the electrical properties of the transistor to be detected. In this way, the method for detecting the display panel may be implemented without any additional process prior to detection of the transistor to be detected, such that batch detection may be realized.

Optionally, the electrical test device (e.g., 40) includes the flexible needle (e.g., 41), and conductively coupling the electrical test device to the at least one test pad (e.g., 13) includes conductively coupling the flexible needle to the at least one test pad. The flexible needle is formed from a relatively soft material, allowing increased flexibility as compared to conventional hard needles. In some examples, the flexible needle may be referred to as an electrical test probe, or as a "bull hair" needle (e.g., having a diameter and flexibility substantially similar to a bull hair).

The method for detecting the display panel (e.g., 50) may include the electrical test device (e.g., 40) being conductively coupled to the at least one test pad (e.g., 13) via the flexible needle (e.g., 41). A small diameter and a soft material of the flexible needle may avoid test pad damage resulting from conventional hard needle detection methods.

Optionally, the flexible needle has a diameter of 0.2 microns.

Based on the exemplary embodiments of the display panel of the present disclosure described with reference to FIGS. 1-7, 17, and 21, an exemplary embodiment of the method for preparing, or manufacturing, the display panel of the present disclosure will be described below with reference to FIGS. 8-14 and 18-20.

Figure 8:
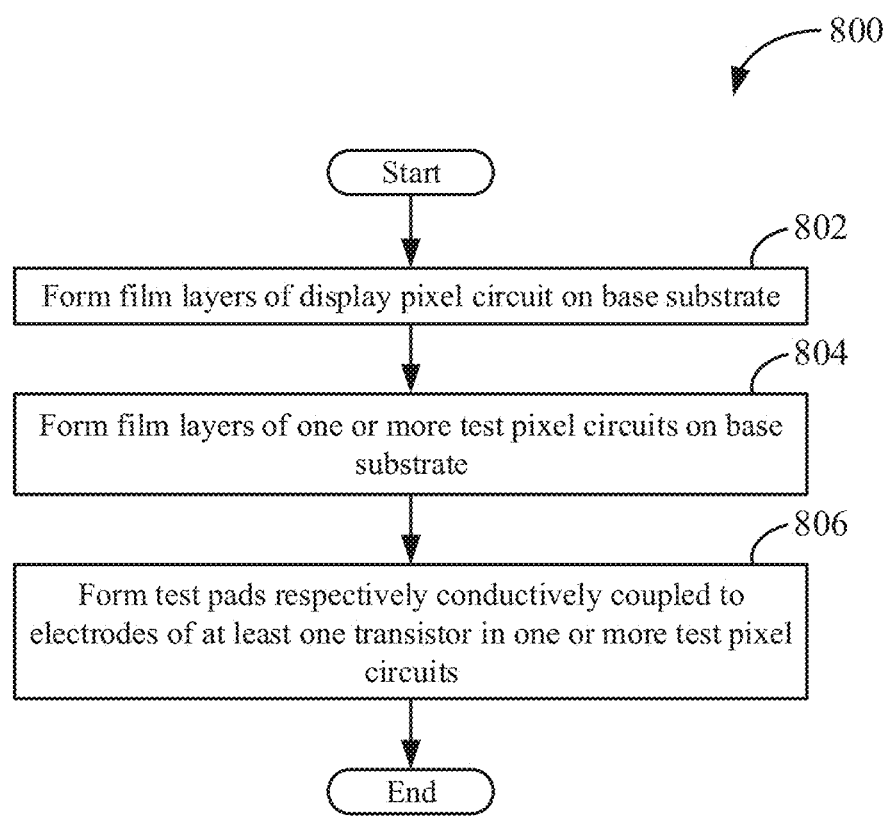
FIG. 8 shows a flow diagram of a method of manufacturing the display panel, according to an embodiment of the present disclosure.

Referring now to FIG. 8, a flow diagram 800 of a method of manufacturing a display panel is depicted. The display panel may be the display panel 50 described above with reference to FIGS. 1-7, 17, and 21. As such, components described with reference to FIG. 8 may be examples of corresponding components of the display panel 50 of FIGS. 1-7, 17, and 21.

At 802, each of a plurality of film layers of the display pixel circuit (e.g., 51) may be formed on the base substrate (e.g., 23).

At 804, each of a plurality of film layers of the one or more test pixel circuits (e.g., 21) may be formed on the base substrate (e.g., 23).

At 806, the test pads (e.g., 13) may be formed such that the test pads are respectively conductively coupled to electrodes of at least one of the plurality of transistors in the one or more test pixel circuits (e.g., 21).

Optionally, the manufacturing method of the display panel (e.g., 50) may further include that forming each of the plurality of film layers of the one or more test pixel circuits (e.g., 21) on the base substrate (e.g., 23) simultaneously forms each of a plurality of film layers of the plurality of environmental pixel circuits (e.g., 23). In some examples, the plurality of film layers of the one or more test pixel circuits and the plurality of film layers of the plurality of environmental pixel circuits may be the same plurality of film layers.

Figure 18:
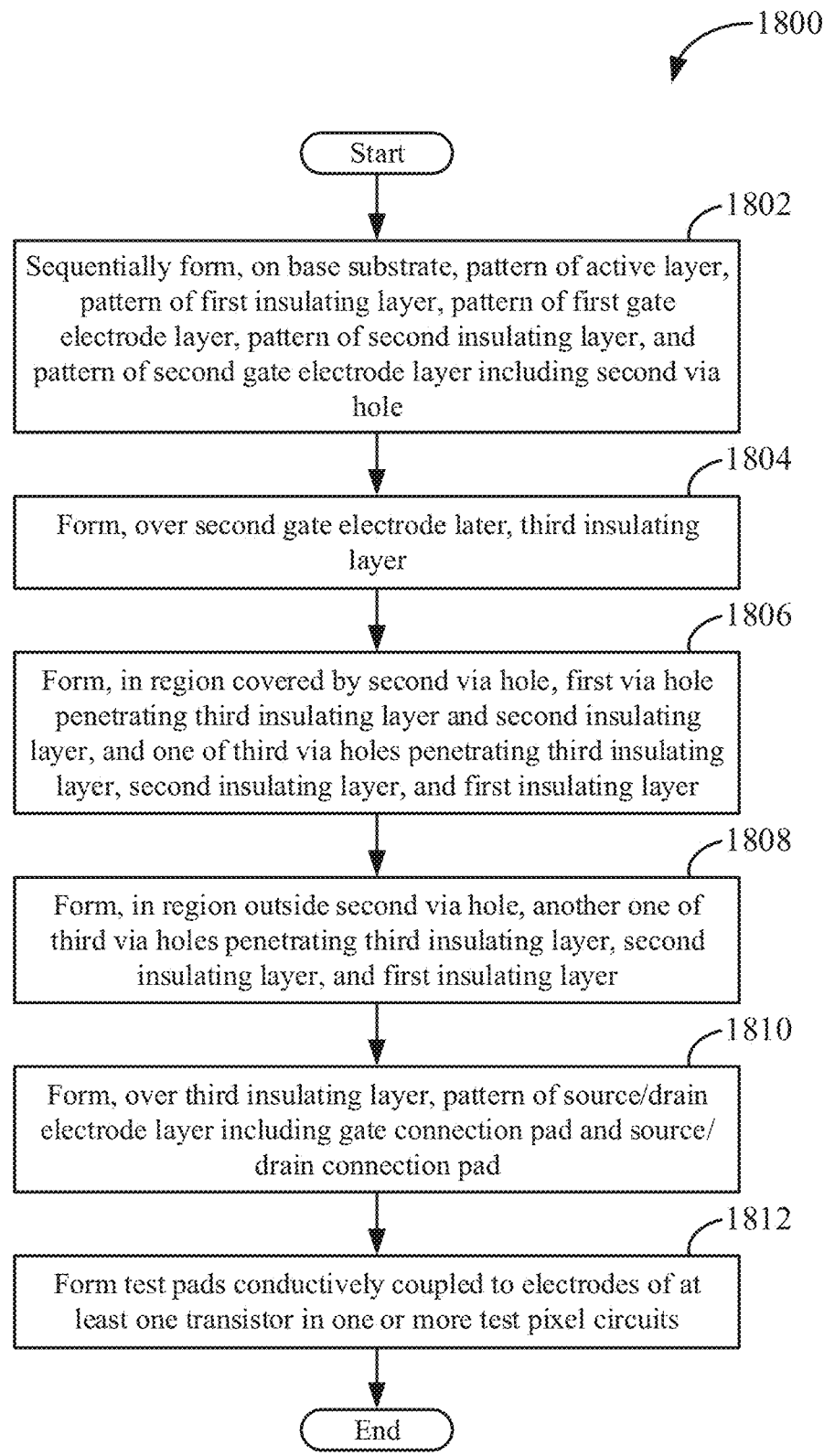
FIG. 18 shows a flow diagram of a method of forming film layers of the test pixel circuit.

Referring now to FIG. 18, a flow diagram 1800 of a method of forming a plurality of film layers of one or more test pixel circuits on a base substrate of a display panel is depicted. The one or more test pixel circuits, the base substrate, and the display panel may be the one or more test pixel circuits 21, the base substrate 23, and the display panel 50 described above with reference to FIGS. 1-7, 17, and 21. As such, components described with reference to FIG. 18 may be examples of corresponding components of the one or more test pixel circuits 21, the base substrate 23, and the display panel 50 of FIGS. 1-7, 17, and 21.

At 1802, a pattern of the active layer (e.g., 5), a pattern of the first insulating layer (e.g., 6), a pattern of the first gate electrode layer (e.g., 7), a pattern of the second insulating layer (e.g., 8), and a pattern of the second gate electrode layer (e.g., 9) including the second via hole (e.g., 28) may be sequentially formed on the base substrate (e.g., 23).

At 1804, the third insulating layer (e.g., 10) may be formed over the second gate electrode layer (e.g., 9).

At 1806, each of the first via hole (e.g., 27) penetrating the third insulating layer (e.g., 10) and the second insulating layer (e.g., 8) and one of the third via holes (e.g., 30) penetrating the third insulating layer, the second insulating layer, and the first insulating layer (e.g., 6) may be formed in a region covered by the second via hole (e.g., 28) of the second gate electrode layer (e.g., 9).

At 1808, another one of the third via holes (e.g., 30) penetrating the third insulating layer (e.g., 10), the second insulating layer (e.g., 8), and the first insulating layer (e.g., 6) may be formed in a region outside the second via hole (e.g., 28) of the second gate electrode layer (e.g., 9).

At 1810, a pattern of the source/drain electrode layer (e.g., 11) including the gate connection pad (e.g., 15) and the source/drain connection pad (e.g., 24) may be formed over the third insulating layer (e.g., 10). The gate connection pad may be conductive coupled to gates of at least one of the plurality of transistors, the gates being located in the first gate electrode layer (e.g., 7), through the first via hole (e.g., 27) penetrating the third insulating layer and the second insulating layer (e.g., 8). The source/drain connection pad may be conductively coupled to each of sources and drains of the at least one of the plurality of transistors, each of the sources and the drains being located in the source/drain electrode layer, through the third via holes (e.g., 30) penetrating the third insulating layer, the second insulating layer, and the first insulating layer (e.g., 6).

At 1812, the test pads (e.g., 13) may be formed such that the test pads are respectively conductively coupled to electrodes of the at least one of the plurality of transistors in the one or more test pixel circuits (e.g., 21).

Figure 19:
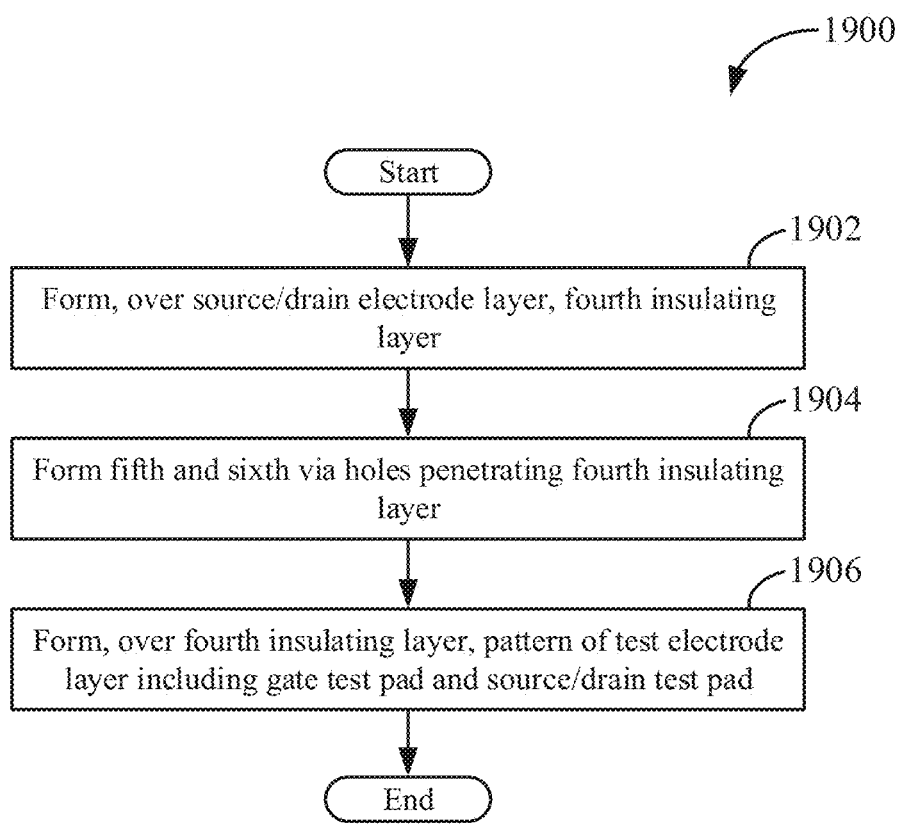
FIG. 19 shows a flow diagram of a method of forming test pads of the test pixel circuit.

Referring now to FIG. 19, a flow diagram 1900 of a method of forming test pads respectively conductively coupled to electrode of at least one of a plurality of transistors in one or more test pixel circuits of a display panel is depicted. The test pads, the one or more test pixel circuits, and the display panel may be the test pads 13, the one or more test pixel circuits 21, and the display panel 50 described above with reference to FIGS. 1-7, 17, and 21. As such, components described with reference to FIG. 19 may be examples of corresponding components of the test pads 13, the one or more test pixel circuits 21, and the display panel 50 of FIGS. 1-7, 17, and 21.

At 1902, the fourth insulating layer (e.g., 12) may be formed over the source/drain electrode layer (e.g., 11).

At 1904, the fifth via hole (e.g., 26) and the sixth via holes (e.g., 36) penetrating the fourth insulating layer may be formed. The fifth and sixth via holes may respectively expose the gate connection pad (e.g., 15) and the source/drain connection pad (e.g., 24).

At 1906, a pattern of the test electrode layer (e.g., 39) including the gate test pad (e.g., 18) and the source/drain test pad (e.g., 25) may be formed over the fourth insulating layer. The gate test pad may be conductively coupled to the gate connection pad (e.g., 15) through the fifth via hole penetrating the fourth insulating layer. The source/drain test pad may be conductively coupled to the source/drain connection pad (e.g., 24) through the sixth via holes penetrating the fourth insulating layer.

In the method of manufacturing the display panel (e.g., 50), the electrodes of the transistor to be detected are led out through the electrode connection pads (e.g., the gate connection pad 15, the source/drain connection pad 24), such that the electrodes of the transistor to be detected are respectively conductively coupled to the electrode test pads (e.g., the gate test pad 18, the source/drain test pads 25) through the electrode connection pads. As such, the electrical test device (e.g., 40) may be conductively coupled to the electrode test pads to electrically detect the transistor to be detected. Further since the second via hole (e.g., 28) is formed in the second gate electrode layer (e.g., 9), and the third insulating layer (e.g., 10) may both fill the second via hole and be in contact with the second insulating layer (e.g., 8) in the region covered by the second via hole, the third and second insulating layers in the region covered by the second via hole may be directly punched through. In this way, the process of exposing the electrodes of the transistor to be detected in the region covered by the second via hole is relatively simple and easy to implement. Further, since the electrode connection pads are respectively conductively coupled to the electrodes of the transistor to be detected, the electrode connection pads and the second gate electrode layer are also prevented from being short-circuited.

Optionally, after the pattern of the test electrode layer (e.g., 39) is formed on the fourth insulating layer (e.g., 12), the method of manufacturing the display panel (e.g., 50) may further include forming the fifth insulating layer (e.g., 14). Further, the seventh via hole (e.g., 37) and the eighth via holes (e.g., 38) may be formed on the fifth insulating layer. The seventh and eighth via holes may respectively expose the gate test pad (e.g., 18) and the source/drain test pad (e.g., 25).

Figure 20:
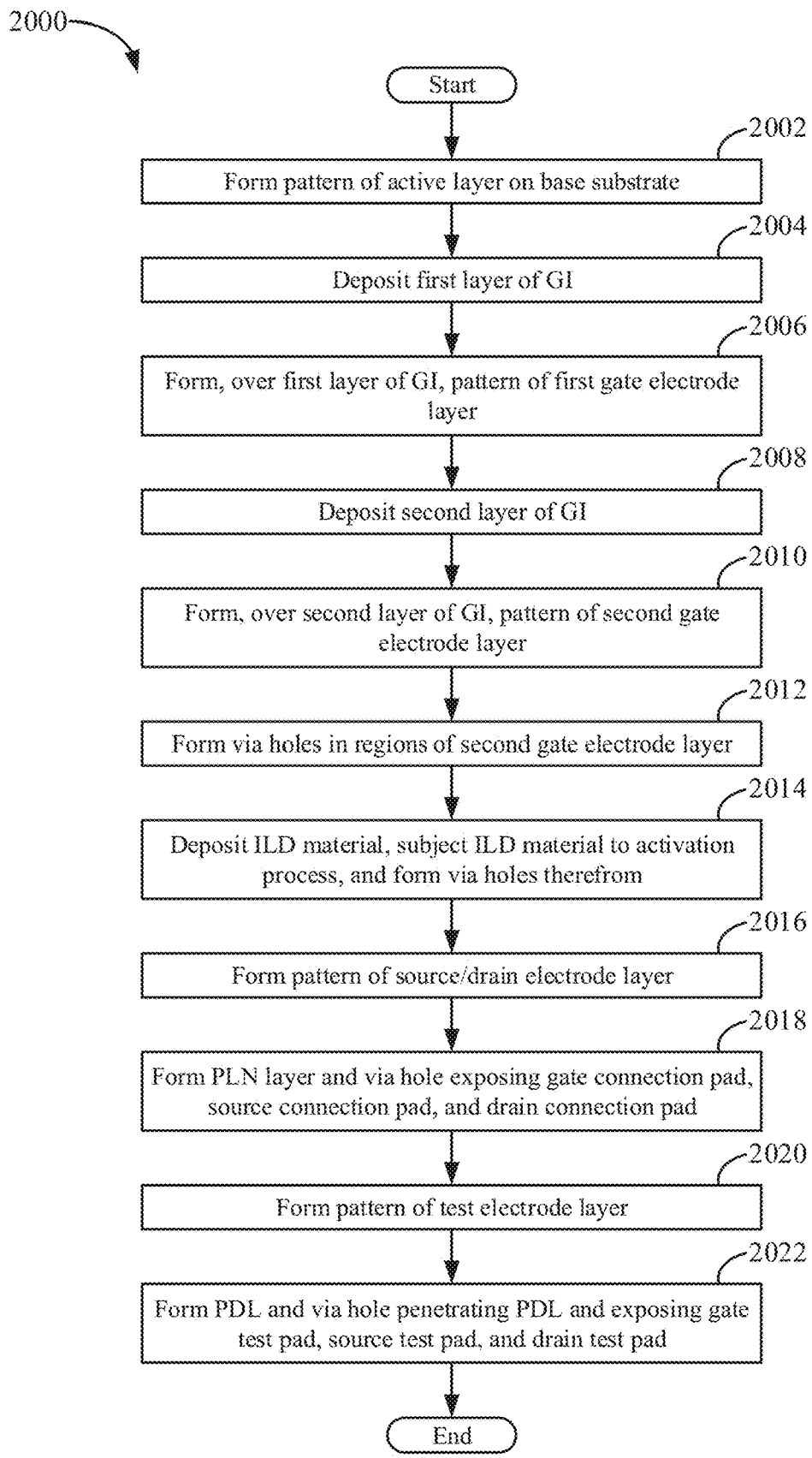
FIG. 20 shows a flow diagram of a method of manufacturing the test pixel circuit and the eight environmental pixel circuits.

Referring now to FIG. 20, a flow diagram 2000 of a method of manufacturing a test pixel circuit and eight environmental pixel circuits for a display panel is depicted. The test pixel circuit and the eight environmental pixel circuits may be the test pixel circuit 21 and the eight environmental pixel circuits 22 described above with reference to FIG. 3. As such, components described with reference to FIG. 20 may be examples of corresponding components of the test pixel circuit 21 and the eight environmental pixel circuits 22 of FIG. 3. Further, the display panel may be the display panel 50 described above with reference to FIGS. 1-7, 17, and 21. As such, components described with reference to FIG. 20 may be examples of corresponding components of the display panel 50 of FIGS. 1-7, 17, and 21. Specifically, the test pixel circuit (e.g., 21) may include the first switching transistor (e.g., T1), the second switching transistor (e.g., T2), the third switching transistor (e.g., T4), the fourth switching transistor (e.g., T5), the fifth switching transistor (e.g., T6), the sixth switching transistor (e.g., T7), the driving transistor (e.g., T3), and the capacitor (e.g., $C_{st}$), where the driving transistor may be a transistor to be detected.

At 2002, the pattern of the active layer (e.g., 5) may be formed on the base substrate (e.g., 23).

Figure 9:
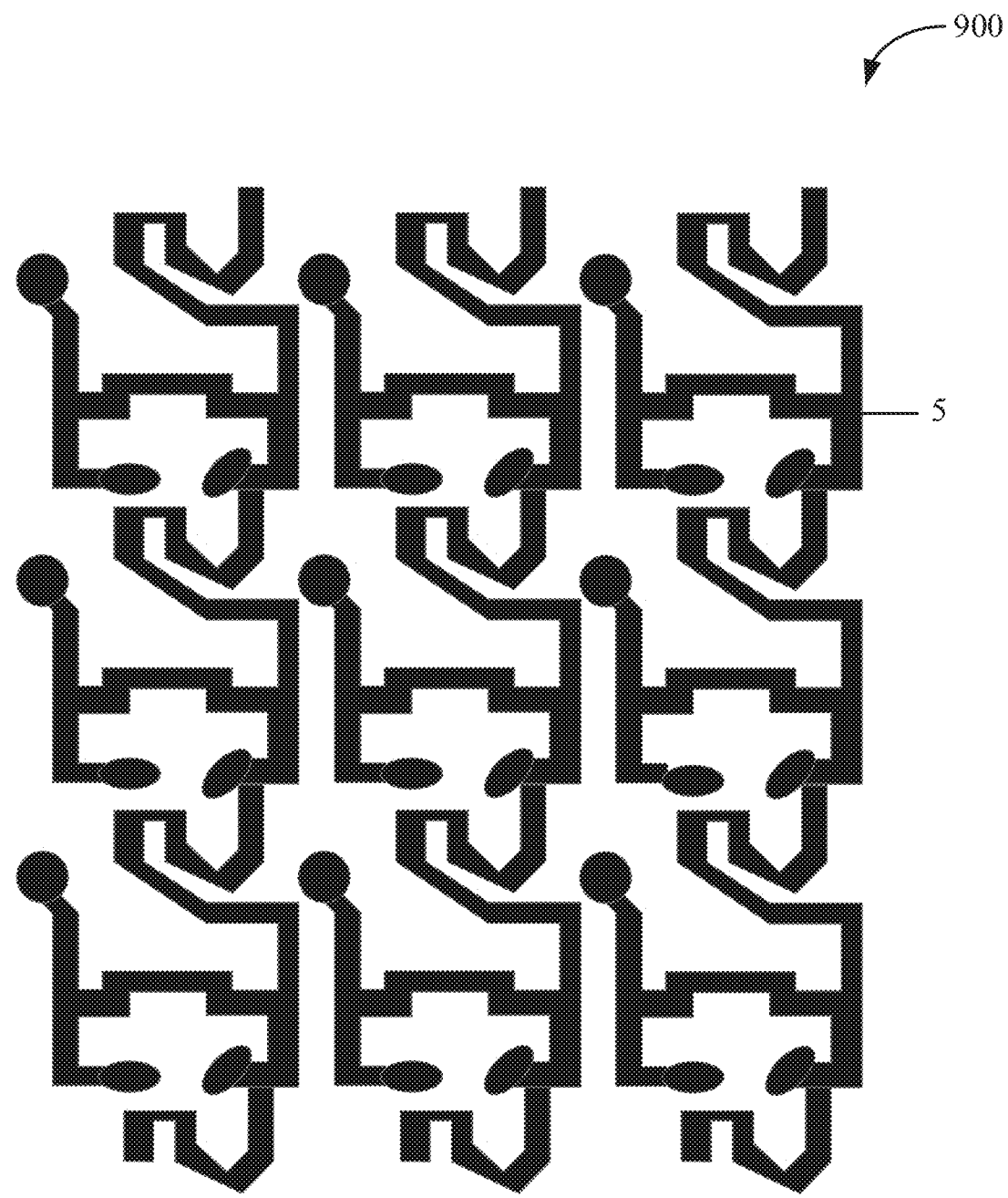
FIG. 9 shows a schematic structural diagram of a first example step of a manufacturing process of the display panel.

Referring now to FIG. 9, a schematic structural diagram 900 of a first example step of a manufacturing process of the display panel (e.g., 50) is depicted. In some examples, forming the pattern of the active layer 5 on the base substrate (e.g., 23) may include depositing an amorphous silicon (a-Si) layer on the base substrate. The a-Si layer may then be subjected to an excimer laser annealing (ELA) process to form polycrystalline silicon (p-Si) and may further be etched to form the pattern of the active layer 5, as shown in FIG. 9, and subjected to a threshold voltage ($V_{TH}$) doping process.

Referring now to FIG. 20, at 2004, a first layer of GI may be deposited.

At 2006, the pattern of the first gate electrode layer (e.g., 7) may be formed over the first layer of GI.

Figure 10:
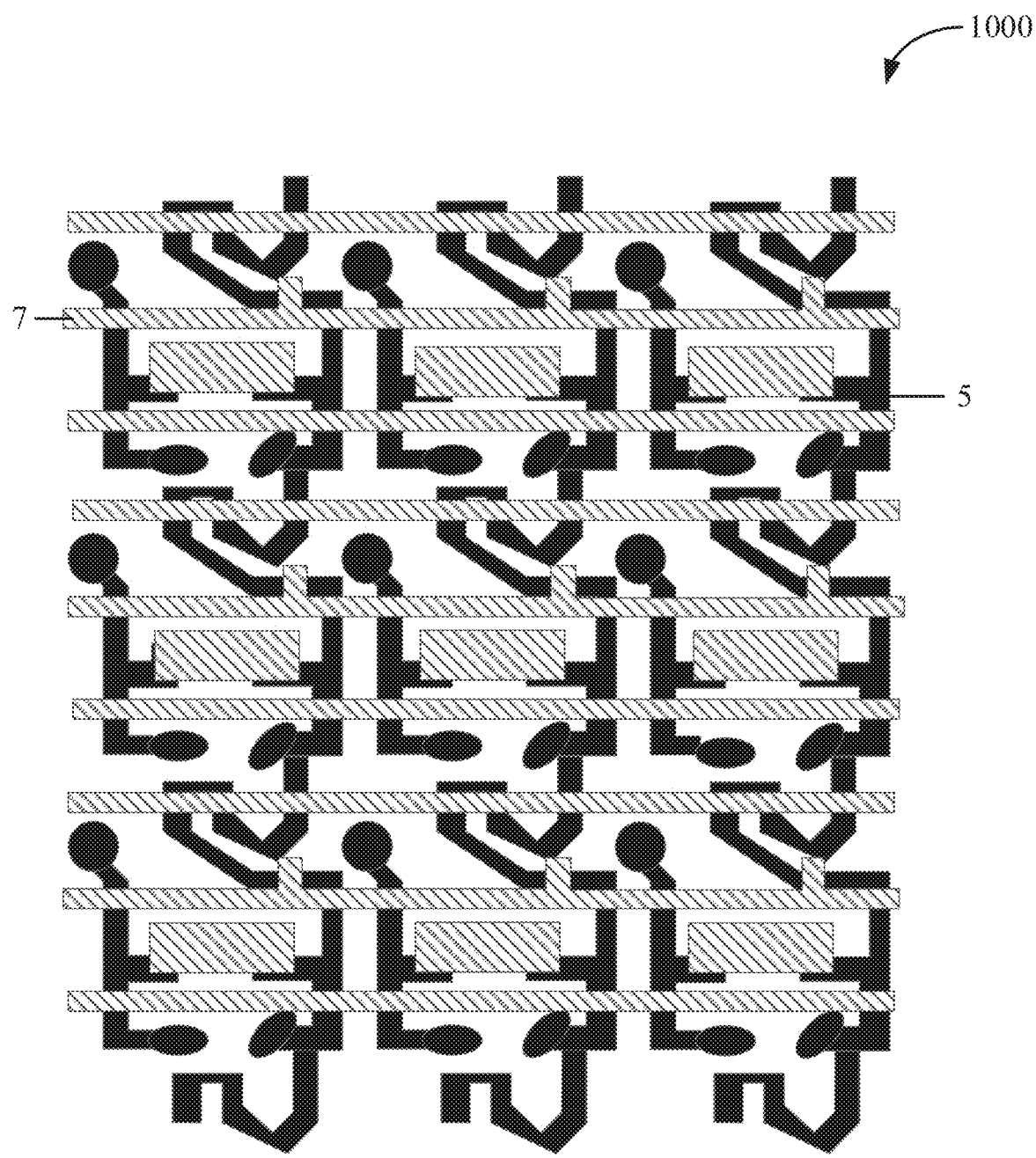
FIG. 10 shows a schematic structural diagram of a second example step of a manufacturing process of the display panel.

Referring now to FIG. 10, a schematic structural diagram 1000 of a second example step of the manufacturing process of the display panel (e.g., 50) is depicted. The first gate electrode layer 7 may be formed over a stack of the first layer of GI, the active layer 5, and the base substrate (e.g., 23). In some examples, the first gate electrode layer 7 may be subjected to a positive (P) doping process.

Referring now to FIG. 20, at 2008, a second layer of GI may be deposited.

At 2010, the pattern of the second gate electrode layer (e.g., 9) may be formed over the second layer of GI.

Figure 11:
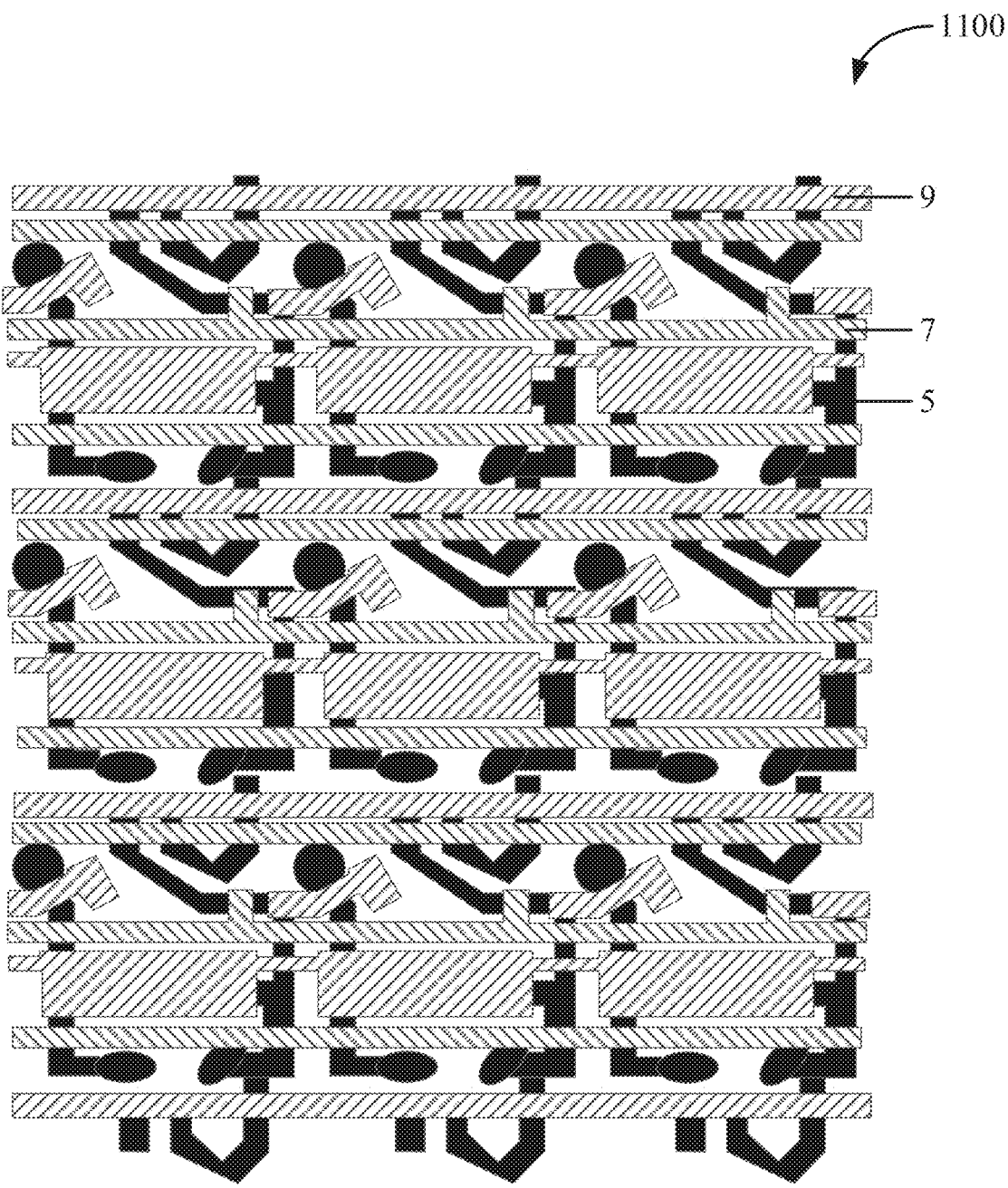
FIG. 11 shows a schematic structural diagram of a third example step of a manufacturing process of the display panel.

Referring now to FIG. 11, a schematic structural diagram 1100 of a third example step of the manufacturing process of the display panel (e.g., 50) is depicted. The second gate electrode layer 9 may be formed over a stack of the second layer of GI, the first gate electrode layer 7, the first layer of GI, the active layer 5, and the base substrate (e.g., 23).

Referring now to FIG. 20, at 2012, via holes may be respectively formed in regions (e.g., 33) of the second gate electrode layer (e.g., 9).

Figure 12:
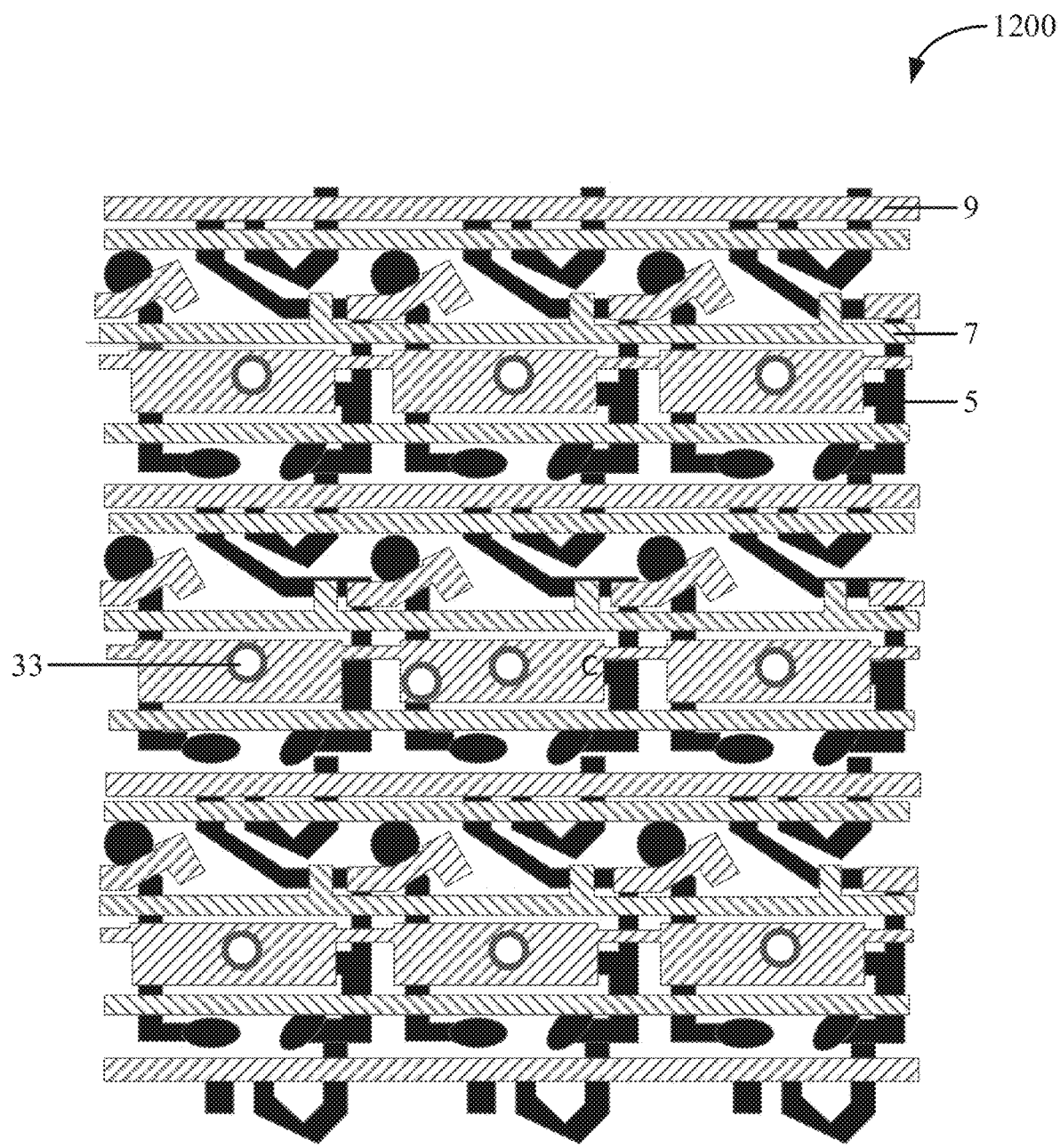
FIG. 12 shows a schematic structural diagram of a fourth example step of a manufacturing process of the display panel.

Referring now to FIG. 12, a schematic structural diagram 1200 of a fourth example step of the manufacturing process of the display panel (e.g., 50) is depicted. The via holes are shown within the regions 33 of the second gate electrode layer 9 disposed over the stack of the second layer of GI, the first gate electrode layer 7, the first layer of GI, the active layer 5, and the base substrate (e.g., 23). In the schematic structural diagram 1200, one via hole is formed in the second gate electrode layer 9 of each environmental pixel circuit (e.g., 22) and two via holes are formed in the second gate electrode layer of the test pixel circuit (e.g., 21).

Referring now to FIG. 20, at 2014, an ILD material may be deposited, subjected to an activation process, and via holes may be formed therefrom.

Figure 13:
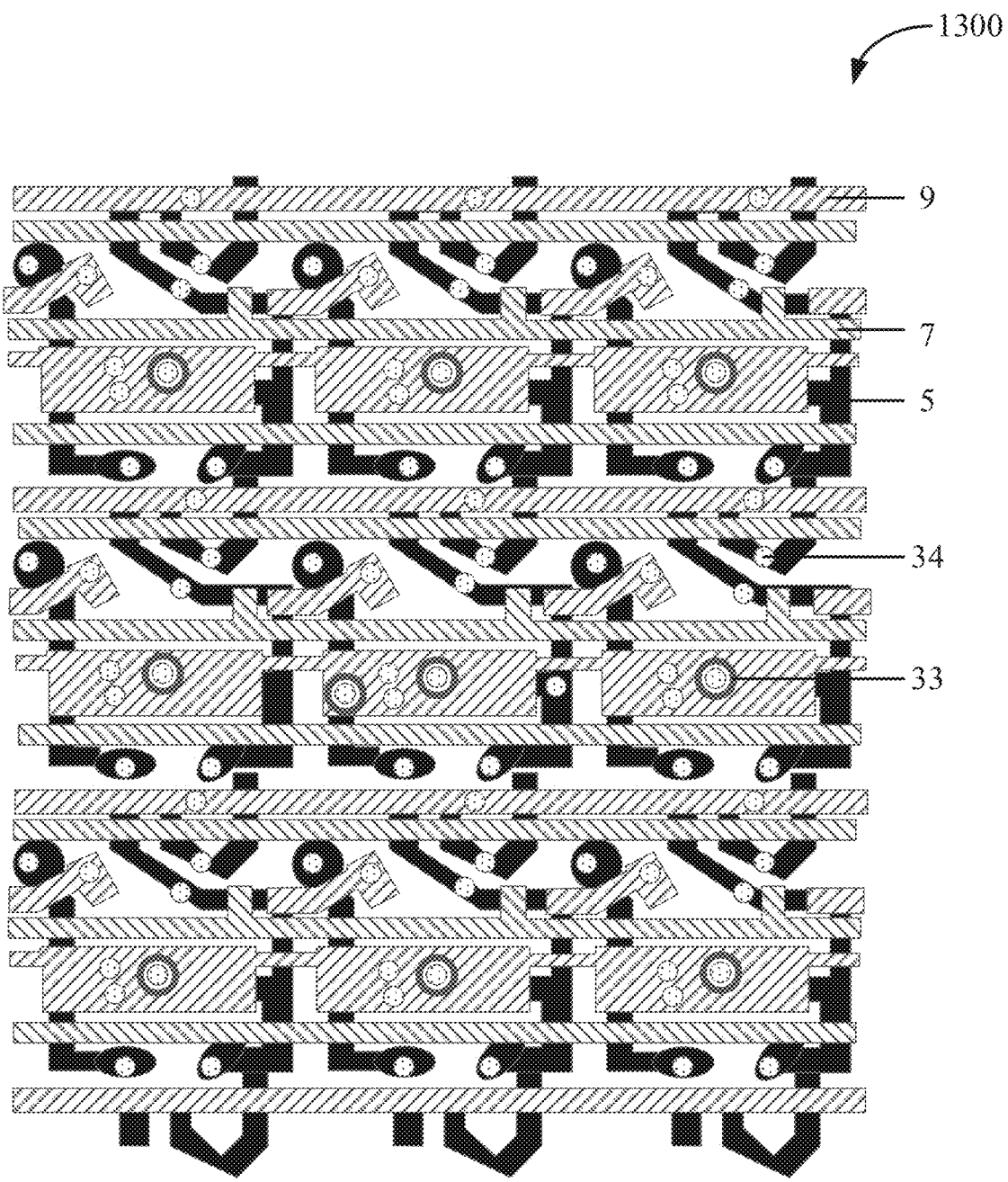
FIG. 13 shows a schematic structural diagram of a fifth example step of a manufacturing process of the display panel.

Referring now to FIG. 13, a schematic structural diagram 1300 of a fifth example step of the manufacturing process of the display panel (e.g., 50) is depicted. As shown, an orthographic projection in a direction perpendicular to a plane of the schematic structural diagram 1300 depicts regions 34 wherein the via holes may be respectively formed from the ILD material. Specifically, the regions 34 are shown projected over the stack of the second gate electrode layer 9, the second layer of GI, the first gate electrode layer 7, the first layer of GI, the active layer 5, and the base substrate (e.g., 23), wherein the second gate electrode layer includes the regions 33.

A portion of the via holes may be formed through the ILD material and the second layer of GI, and a further portion of via holes may be formed through the ILD material, the second layer of GI, and the first layer of GI. Further, an annealing process may be performed after etching the ILD material to a surface of p-Si. It will be appreciated that, after forming a layer of the ILD material, in addition to forming via holes such that various electrode pads may be conductively coupled to electrodes of the driving transistor (e.g., T3), further via holes may be formed to allow the various transistors and capacitors to be conductively coupled to one another. In the schematic structural diagram 1300, as compared to each of the eight environmental pixel circuits (e.g., 22), the test pixel circuit (e.g., 21) may include two additional via holes, such that the source/drain connection pad (e.g., 24, which may include the source connection pad 16 and the drain connection pad 17) may be conductively coupled to each of the source and the drain of the driving transistor through the two additional via holes, respectively.

Referring now to FIG. 20, at 2016, the pattern of the source/drain electrode layer (e.g., 11) may be formed.

Figure 14:
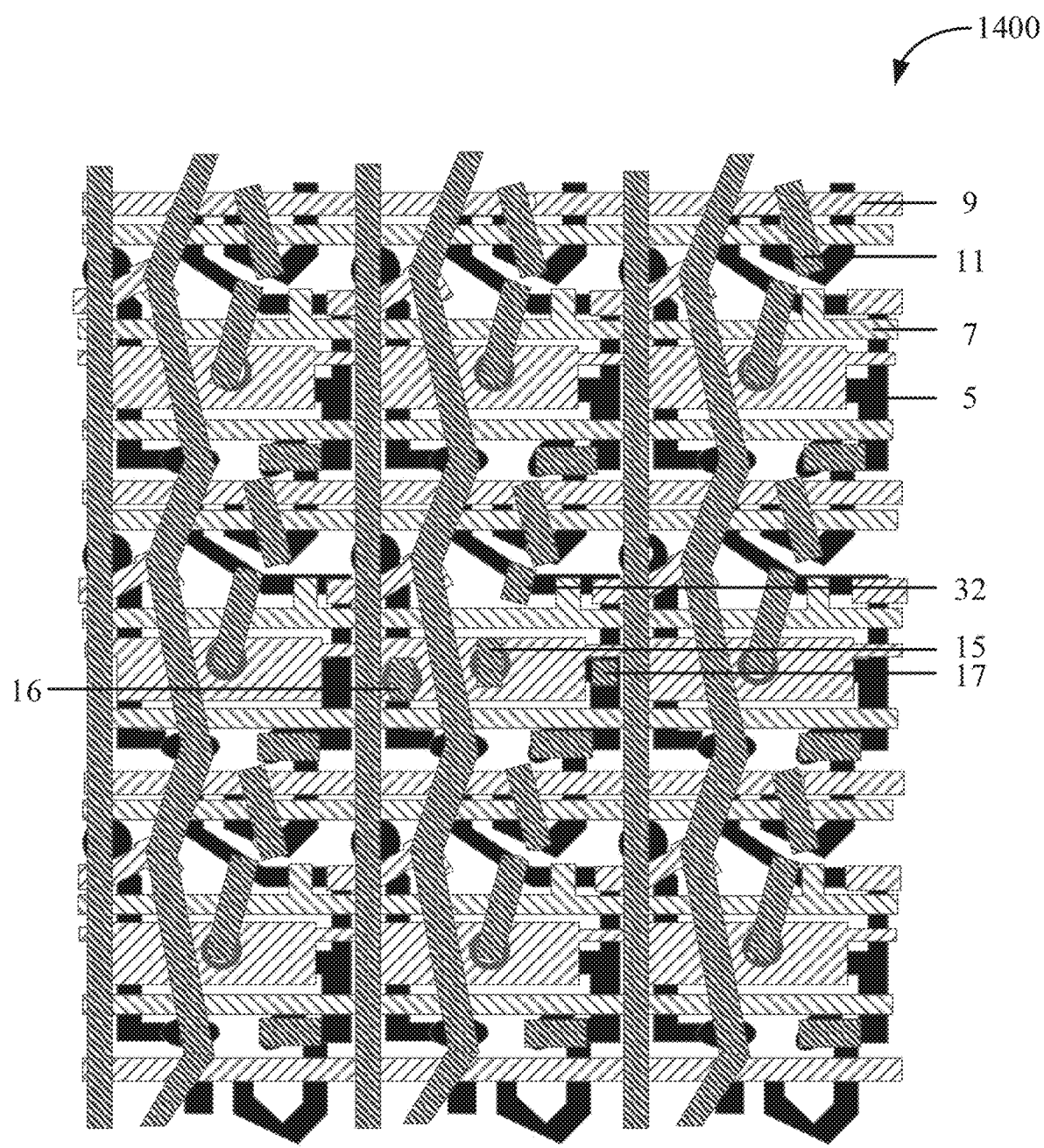
FIG. 14 shows a schematic structural diagram of a sixth example step of a manufacturing process of the display panel.

Referring now to FIG. 14, a schematic structural diagram 1400 of a sixth example step of the manufacturing process of the display panel (e.g., 50) is depicted. The pattern of the source/drain electrode layer 11 may include the gate connection pad 15, the source connection pad 16, and the drain connection pad 17. Further, the source/drain electrode layer 11 may include additional connection lines (such as connection line 32). As compared to each of the eight environmental pixel circuits (e.g., 22), in the test pixel circuit (e.g., 21), a connection between the gate connection pad 15 and the source of the second switching transistor (e.g., T2) may be broken. The source/drain electrode layer 11 may be formed over a stack of the second gate electrode layer 9, the second layer of GI, the first gate electrode layer 7, the first layer of GI, the active layer 5, and the base substrate (e.g., 23).

Referring now to FIG. 20, at 2018, each of a PLN layer and a via hole exposing each of the gate connection pad (e.g., 15), the source connection pad (e.g., 16), and the drain connection pad (e.g., 17) may be formed.

At 2020, the pattern of the test electrode layer (e.g., 39) may be formed. The pattern of the test electrode layer may include the gate test pad (e.g., 18), the source test pad (e.g., 19), and the drain test pad (e.g., 20), as shown in FIG. 3. The gate test pad, the source test pad, and the drain pad may be respectively conductively coupled to the gate connection pad (e.g., 15), the source connection pad (e.g., 16), and the drain connection pad (e.g., 17) through respective via holes penetrating the PLN layer. A material of the test electrode layer may be, for example, a metal. In some examples, the pattern of the test electrode layer further includes an anode of the display area (e.g., 1), such that the test electrode layer and the anode of the display area may be formed with the same pattern. As such, a total number of patterns utilized is reduced.

At 2022, a PDL and a via hole penetrating the PDL and exposing each of the gate test pad (e.g., 18), the source test pad (e.g., 19), and the drain test pad (e.g., 20) may be formed.

Based on the exemplary embodiments of the display panel of the present disclosure described with reference to FIGS. 1-7, 17, and 21, an exemplary embodiment of the display device of the present disclosure will be described below with reference to FIG. 16.

Figure 16:
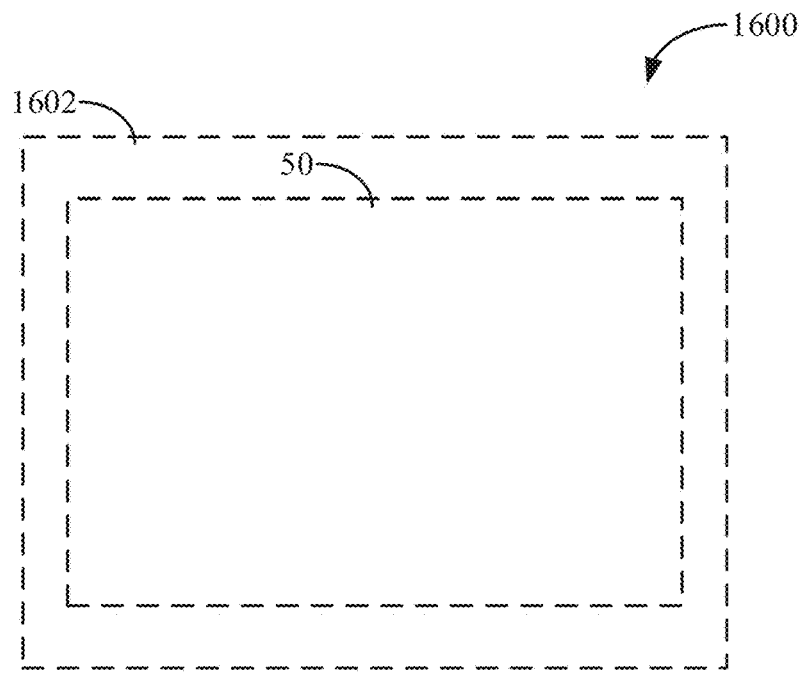
FIG. 16 shows a schematic structural diagram of a display device, according to an embodiment of the present disclosure.

Referring now to FIG. 16, a schematic structural diagram 1600 of a display device 1602 is depicted. As shown, the display device 1602 may include the display panel 50. The display device 1602 may be, for example, a device such as a mobile phone, a computer, a television, etc.

In this way, in embodiments of the display panel, the method for detecting the display panel, the method for preparing the display panel, and the display device provided by the present disclosure, the non-display area of the display panel includes each of the one or more test pixel circuits having the same circuit structure as any of the display pixel circuits, that is, the portion of the plurality of transistors in the one or more test pixel circuits are conductively coupled in a manner such that the electrical properties of the portion of the plurality of the transistors in a given display pixel circuit in the display area may be simulated, as the electrical properties of the portion of the plurality of transistors in the one or more test pixel circuits are substantially similar to the electrical properties of the portion of the plurality of transistors in the given display pixel circuit. The technical effect of the one or more test pixel circuits and the display pixel circuits having equivalent circuit structures is that the electrical properties of the portion of the plurality of transistors in the test pixel circuit may characterize the electrical properties of the portion of the plurality of the transistors in the display pixel circuit, and an accuracy of detecting the electrical properties of the plurality of transistors as a whole may be improved. Further, since electrodes of at least one of the plurality of transistors may be respectively coupled to different test pads, each electrode of the at least one of the plurality of transistors may be electrically tested by using an electrical test device without any additional process, such that batch detection may be realized.

It will be appreciated that the various embodiments of the present disclosure are described in a progressive manner, wherein each embodiment focuses on differences from other embodiments, and similar parts between the various embodiments may be referred to each other.

It will be appreciated that ordinal terms such as "first" and "second" are used merely to distinguish one entity or operation from another entity or operation, and do not necessarily require or imply any such actual relationship or order between these entities or operations.

FIGS. 1-6 and 9-14 show example configurations with relative positioning of the various components described herein. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space there-between and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

It is to be understood that the above embodiments are merely exemplary embodiments employed to explain the principles of the inventive concepts, but the inventive concepts are not limited thereto. Various modifications and improvements can be made by those skilled in the art without departing from the spirit and scope of the disclosure, and such modifications and improvements are also considered to be within the scope of the disclosure.

The invention claimed is:

1. A display panel, comprising:
a display area comprising a plurality of pixels; and
a non-display area surrounding the display area;
each of the plurality of pixels comprises a display pixel circuit; and
the non-display area comprises one or more test pixel circuits, each of the one or more test pixel circuits having an equivalent circuit structure to the display pixel circuit, where the one or more test pixel circuits include a plurality of transistors, and electrodes of at least one of the plurality of transistors are respectively conductively coupled to different test pads and at least one of the conductive couplings formed through a via penetrating at least one insulating layer.

2. The display panel of claim 1, wherein the non-display area further comprises:
a plurality of environmental pixel circuits, each of the plurality of environmental pixel circuits having an equivalent circuit structure to the display pixel circuit, where the plurality of environmental pixel circuits surrounds at least one of the one or more test pixel circuits.

3. The display panel of claim 2, wherein each of the one or more test pixel circuits is surrounded by eight environmental pixel circuits of the plurality of environmental pixel circuits, such that any one of the one or more test pixel circuits and a corresponding eight surrounding environmental pixel circuits are arranged in a 3×3 array, the one of the one or more test pixel circuits included in the 3×3 array being located at a center of the 3×3 array.

4. The display panel of claim 2, wherein
the one or more test pixel circuits comprise one or more 3×3 arrays of test pixel circuits; and
each of the one or more 3×3 arrays of test pixel circuits is surrounded by sixteen environmental pixel circuits of the plurality of environmental pixel circuits, such that any one of the one or more 3×3 arrays of test pixel circuits and a corresponding sixteen surrounding environmental pixel circuits are arranged in a 5×5 array, the one of the one or more 3×3 arrays of test pixel circuits included in the 5×5 array being located at a center of the 5×5 array.

5. The display panel of claim 2, wherein
the non-display area is divided into a test area and a border area adjacent to the test area; and
each of the one or more test pixel circuits and the plurality of environmental pixel circuits are located in the test area and/or the border area.

6. The display panel of claim 1, wherein electrodes of each of the plurality of transistors included in the one or more test pixel circuits are respectively conductively coupled to different test pads.

7. The display panel of claim 6, wherein each of the one or more test pixel circuits comprises a first group of transistors, the first group of transistors comprising a driving thin-film transistor (TFT), the driving TFT comprising a gate electrode, a source electrode, and a drain electrode, the gate electrode conductively coupled to a gate test pad, the source electrode conductively coupled to a source test pad, and the drain electrode conductively coupled to a drain test pad.

8. The display panel of claim 6, wherein
the one or more test pixel circuits include a first group of transistors, each of the first group of transistors comprising a first transistor and a second transistor, the first transistor comprising a first gate electrode, a first source electrode, and a first drain electrode, the second transistor comprising a second gate electrode, a second source electrode, and second drain electrode; and
the first gate electrode is conductively coupled to a first gate test pad, the first source electrode is conductively coupled to a first source test pad, the first drain electrode is conductively coupled to a first drain test pad, the second gate electrode is conductively coupled to a second gate test pad, the second source electrode is conductively coupled to a second source test pad, and the second drain electrode is conductively coupled to a second drain test pad.

9. The display panel of claim 8, wherein the first gate test pad and the second gate test pad are a common gate test pad.

10. The display panel of claim 8, wherein the first gate test pad and the second gate pad are a common gate test pad, and the first drain test pad and the second drain test pad are a common drain test pad.

11. The display panel of claim 8, wherein the first gate test pad and the second gate pad are a common gate test pad, and the first source test pad and the second source test pad are a common source test pad.

12. The display panel of claim 1, wherein the one or more test pixel circuits comprise:
an active layer, a first insulating layer, a first gate electrode layer, a second insulating layer, a second gate electrode layer, a third insulating layer, a source/drain electrode layer, a fourth insulating layer, a test electrode layer, and a fifth insulating layer sequentially stacked on a base substrate;
wherein, for each of the plurality of transistors:
a gate is located in the first gate electrode layer;
a source and a drain are located in the source/drain electrode layer;
the source/drain electrode layer has a gate connection pad and a source/drain connection pad;
the gate connection pad is conductively coupled to the gate through a first via hole penetrating the third insulating layer and the second insulating layer;
the second gate electrode layer has a second via hole for avoiding the gate connection pad;
the source/drain connection pad is conductively coupled to the active layer through third via holes penetrating the third insulating layer, the second insulating layer, and the first insulating layer;
the second gate electrode layer has fourth via holes for avoiding the source/drain connection pad;
the test electrode layer has a gate test pad and a source/drain test pad;
the gate test pad is conductively coupled to the gate connection pad through a fifth via hole penetrating the fourth insulating layer;
the source/drain test pad is conductively coupled to the source/drain connection pad through sixth via holes penetrating the fourth insulating layer; and
the fifth insulating layer has seventh and eighth via holes respectively exposing the gate test pad and the source/drain test pad.

13. The display panel of claim 12, wherein each of the one or more test pixel circuits comprises:
a first switching transistor, a second switching transistor, a third switching transistor, a fourth switching transistor, a fifth switching transistor, a sixth switching transistor, a driving transistor, and a capacitor;
wherein a gate of the driving transistor is conductively coupled to a first electrode of the capacitor and a drain of the first switching transistor;

the drain of the first switching transistor is conductively coupled to a source of the second switching transistor;
a source of the driving transistor is conductively coupled to a drain of the second switching transistor and a source of the fifth switching transistor;
a drain of the driving transistor is conductively coupled to a drain of the third switching transistor and a drain of the fourth switching transistor;
a second electrode of the capacitor is conductively coupled to a source of the fourth switching transistor; and
a drain of the fifth switching transistor is conductively coupled to a drain of the sixth switching transistor.

14. A method for detecting electrical properties of a display panel, the method comprising:
conductively coupling an electrical test device to at least one test pad; and
controlling the electrical test device to perform an electrical test on the electrodes of a transistor conductively coupled to the at least one test pad;
wherein the display panel comprises:
a display area comprising a plurality of pixels; and
a non-display area surrounding the display area;
each of the plurality of pixels comprises a display pixel circuit; and
the non-display area comprises one or more test pixel circuits, each of the one or more test pixel circuits having an equivalent circuit structure to the display pixel circuit, where the one or more test pixel circuits include a plurality of transistors, and electrodes of at least one of the plurality of transistors are respectively conductively coupled to different test pads, and the conductive coupling comprising a first via coupled to a first test pad and second via connected to a second test pad different from the first test pad, the first via and second via penetrating at least one insulating layer.

15. The method of claim 14, wherein
the electrical test device comprises a flexible needle; and
conductively coupling the electrical test device to the at least one test pad includes:
conductively coupling the flexible needle to the at least one test pad.

16. A method of manufacturing a display panel, the method comprising:
forming each film layer of a display pixel circuit on a base substrate;
forming each film layer of one or more test pixel circuits on the base substrate which forms each film layer of a plurality of environmental pixel circuits; and
forming test pads respectively conductively coupled to electrodes of at least one of a plurality of transistors in the one or more test pixel circuits;
wherein the display panel comprises:
a display area comprising a plurality of pixels; and
a non-display area surrounding the display area;
each of the plurality of pixels comprises the display pixel circuit; and
the non-display area comprises the one or more test pixel circuits, each of the one or more test pixel circuits having an equivalent circuit structure to the display pixel circuit, where the one or more test pixel circuits include the plurality of transistors, and the electrodes of the at least one of the plurality of transistors are respectively conductively coupled to different test pads.

17. The method of claim 16, wherein forming each film layer of the one or more test pixel circuits on the base substrate comprises:
sequentially forming, on the base substrate, a pattern of an active layer, a pattern of a first insulating layer, a pattern of a first gate electrode layer, a pattern of a second insulating layer, and a pattern of a second gate electrode layer, where the second gate electrode layer includes a second via hole;
forming, over the second gate electrode layer, a third insulating layer;
forming, in a region covered by the second via hole of the second gate electrode layer, a first via hole penetrating the third insulating layer and the second insulating layer, and one of third via holes penetrating the third insulating layer, the second insulating layer, and the first insulating layer;
forming, in a region outside the second via hole of the second gate electrode layer, another one of the third via holes penetrating the third insulating layer, the second insulating layer, and the first insulating layer;
forming, over the third insulating layer, a pattern of a source/drain electrode layer including a gate connection pad and a source/drain connection pad, where the gate connection pad is conductively coupled to gates of the at least one of the plurality of transistors, the gates being located in the first gate electrode layer, through the first via hole penetrating the third insulating layer and the second insulating layer, and the source/drain connection pad is conductively coupled to sources and drains of the at least one of the plurality of transistors, the source and the drains being located in the active layer, through the third via holes penetrating the third insulating layer, the second insulating layer, and the first insulating layer; and
forming the test pads respectively conductively coupled to the electrodes of the at least one of the plurality of transistors in the one or more test pixel circuits, comprising:
forming, over the source/drain electrode layer, a fourth insulating layer;
forming fifth and sixth via holes penetrating the fourth insulating layer and respectively exposing the gate connection pad and the source/drain connection pad; and
forming, over the fourth insulating layer, a pattern of a test electrode layer, the test electrode layer including a gate test pad and a source/drain test pad, where the gate test pad is conductively coupled to the gate connection pad through the fifth via hole penetrating the fourth insulating layer, and the source/drain test pad is conductively coupled to the source/drain connection pad through the sixth via holes penetrating the fourth insulating layer.

18. The method of claim 17, wherein the pattern of the test electrode layer further includes an anode of the display area.

19. A display device, comprising:
a display panel, the display panel comprising:
a display area comprising a plurality of pixels; and
a non-display area surrounding the display area;
each of the plurality of pixels comprises a display pixel circuit; and
the non-display area comprises one or more test pixel circuits and environmental pixel circuits, each of the one or more test pixel circuits having an equivalent circuit structure to the display pixel circuit, where the one or more test pixel circuits include a plurality of transistors, and electrodes of at least one of the plurality of transistors are respectively conductively coupled to different test pads, each of the different test pads being located in a test electrode layer of the one or more test pixel circuits.

\* \* \* \* \*